(12) United States Patent
Huang

(10) Patent No.: US 11,750,193 B2
(45) Date of Patent: Sep. 5, 2023

(54) SYSTEMS AND METHODS FOR SIGNAL DISTRIBUTION

(71) Applicant: ZHEJIANG DAHUA TECHNOLOGY CO., LTD., Zhejiang (CN)

(72) Inventor: Cichang Huang, Hangzhou (CN)

(73) Assignee: ZHEJIANG DAHUA TECHNOLOGY CO., LTD., Hangzhou (CN)

(*) Notice: Subject to any disclaimer, the term of this patent is extended or adjusted under 35 U.S.C. 154(b) by 6 days.

(21) Appl. No.: 17/446,152

(22) Filed: Aug. 26, 2021

(65) Prior Publication Data

US 2021/0391861 A1 Dec. 16, 2021

Related U.S. Application Data

(63) Continuation of application No. 16/736,850, filed on Jan. 8, 2020, now Pat. No. 11,115,023, which is a continuation of application No. PCT/CN2018/076591, filed on Feb. 13, 2018.

(30) Foreign Application Priority Data

Jul. 24, 2017 (CN) .......................... 201710605942.6

(51) Int. Cl.
*H03K 19/0175* (2006.01)
*H04N 7/14* (2006.01)
*H04N 7/18* (2006.01)

(52) U.S. Cl.
CPC ..... *H03K 19/017509* (2013.01); *H04N 7/148* (2013.01); *H04N 7/18* (2013.01)

(58) Field of Classification Search
CPC ... H03K 19/017509; H03K 19/017518; H03K 19/017527; H04N 7/14; H04N 7/141;
(Continued)

(56) References Cited

U.S. PATENT DOCUMENTS 4,714,959 A 12/1987 Pshtissky
2006/0066725 A1 3/2006 Dodrill et al.
(Continued)

FOREIGN PATENT DOCUMENTS

CN 204615954 U 9/2015
CN 106303299 A 1/2017
(Continued)

OTHER PUBLICATIONS

International Search Report in PCT/CN2018/076591 dated May 7, 2018, 4 pages.
(Continued)

*Primary Examiner* — Diana J. Cheng
(74) *Attorney, Agent, or Firm* — METIS IP LLC

(57) ABSTRACT

A system may comprise at least one signal input circuit configured to receive target input signals from at least one sensor device; at least one signal processing unit. Each of the at least one signal processing unit may include at least one signal output circuit configured to output signals to a first electronic connection; and at least one signal extraction circuit configured to obtain a reverse control signal from the first electronic connection; and at least one signal superimposing circuit configured to generate superimposed reverse control signals by superimposing the first reverse control signal with other electronic signals, and output the superimposed reverse control signal to the signal input circuit.

19 Claims, 16 Drawing Sheets

(58) Field of Classification Search
CPC ........ H04N 7/142; H04N 7/144; H04N 7/147;
H04N 7/148; H04N 7/18; H04N 7/181;
H04N 7/183; H04N 7/185; H04N 7/186;
H04N 7/188; H04N 2007/145
See application file for complete search history.

(56) References Cited

U.S. PATENT DOCUMENTS

| | | |
|---|---|---|
| 2014/0241703 A1 | 8/2014 | Hwang |
| 2015/0244246 A1 | 8/2015 | Krueger et al. |
| 2017/0149470 A1 | 5/2017 | Oh et al. |
| 2019/0313052 A1 | 10/2019 | Deng |

FOREIGN PATENT DOCUMENTS

| | | |
|---|---|---|
| CN | 106303343 A | 1/2017 |
| EP | 1781022 A1 | 5/2007 |
| JP | H07115565 A | 5/1995 |
| JP | 2001224026 A | 8/2001 |
| WO | 2015026801 A1 | 2/2015 |
| WO | 2019019620 A1 | 1/2019 |

OTHER PUBLICATIONS

Written Opinion in PCT/CN2018/076591 dated May 7, 2018, 5 pages.
First Office Action in Chinese Application No. 201710605942.6 dated Apr. 2, 2019, 20 pages.
The Extended European Search Report in European Application No. 18838373.1 dated Apr. 3, 2020, 8 pages.

SYSTEMS AND METHODS FOR SIGNAL DISTRIBUTION

CROSS-REFERENCE TO RELATED APPLICATIONS

This application is a Continuation of U.S. application Ser. No. 16/736,850 filed on Jan. 8, 2020, which is a Continuation of International Application No. PCT/CN2018/076591 filed on Feb. 13, 2018, which claims priority to Chinese Application No. 201710605942.6, filed on Jul. 24, 2017. The contents of above applications are incorporated herein by reference in entirety.

TECHNICAL FIELD

The present disclosure generally relates to electronics, and more specifically, relates to a signal distribution system.

BACKGROUND

A video distributor is shown in FIG. 1. The video distributor 120 may receive an analog video signal sent by a front-end video capture medium 110, distribute the received analog video signal as multi-path analog video signals, and further send the multi-path analog video signals to a back-end storage medium 130.

Standard definition (SD) video transmission technology does not have a coaxial control function when it is necessary to control the front-end video capture medium 110 using a reverse control signal, the front-end video capture medium 110 may be connected to the back-end storage medium 130 through additional cables. The back-end storage medium 130 may then send the reverse control signal to the front-end video capture medium 110 through the additional cables. RS485 signal shown in FIG. 1 may be one type of the reverse control signal.

High definition (HD) video transmission technology may embed the reverse control signal into the video signal. Therefore, the reverse control signal and the video signal may be transmitted through a coaxial cable, thereby eliminating the additional cables. However, the transmission direction of the reverse control signal is opposite to the transmission direction of the video signal, and the existing video distributor cannot transmit the reverse control signal. Therefore, it is desirable to provide a video distributor to satisfy the coaxial control function.

SUMMARY

According to an aspect of the present disclosure, a system may comprise at least one signal input circuit configured to receive target input signals from at least one sensor device; at least one signal processing unit. Each of the at least one signal processing unit may include at least one signal output circuit configured to output signals to a first electronic connection; and at least one signal extraction circuit configured to obtain a reverse control signal from the first electronic connection; and at least one signal superimposing circuit configured to generate superimposed reverse control signals by superimposing the first reverse control signal with other electronic signals, and output the superimposed reverse control signal to the signal input circuit.

In some embodiments, the at least one storage medium may be connected to the at least one output circuit via the first electronic connection, wherein the storage medium is a digital video recorder (DVR); and the at least one sensor device may be connected to the at least one signal input circuit via a second electronic connection, wherein the at least one sensor device includes a camera, and the target input signals are analog video signals.

In some embodiments, the system may further comprise a signal distributor connected to the at least one signal input circuit to distribute the target input signals to the at least one signal processing units.

In some embodiments, the system may further comprise at least one switch including at least one input terminal connected to the distributor; at least one output terminal connected to the at least one signal output circuit; and at least one control terminal connected the at least one signal extraction circuit with the signal distributor.

In some embodiments, the at least one signal extraction circuit may be further configured to detect the reverse control signal via the first connection, and in response to a detection of the reverse control signal from the first electronic connection, disconnect the at least one switch to disconnect the signal distributor from the at least one signal output circuit.

In some embodiments, the system may further comprise at least one load detection circuit connecting the signal output circuit with the at least one output terminal of the at least one switch.

In some embodiments, the at least one load detection circuit may be configured to detect whether the at least one signal output circuit is connected to the storage medium via the first electronic connection; in response to a detection that the storage medium is not connected to the at least one signal output circuit, control the at least one switch to disconnect the signal distributor from the at least one signal output circuit.

In some embodiments, in response to a detection that the storage medium is connected to the signal output circuit via the first connection, the load detection circuit sends a first closing signal to the at least one switch; in response to a detection of the reverse control signal from the first connection, the at least one signal extraction circuit sends a second closing signal to the at least one switch; and the at least one switch closes upon receiving the first closing signal and the second closing signal.

In some embodiments, the at least one signal extraction circuit may include a plurality of signal extraction circuits; and the system further comprises at least one first or gate connecting the plurality of signal extraction circuits with the at least one output terminal of the at least one switch.

In some embodiments, the at least one signal extraction circuit may be further configured to in response to the detection of the reverse control signal from the first electronic connection, send a first disconnecting signal to the at least one first or gate to control the at least one first or gate to transmit a disconnecting signal to the at least one switch.

In some embodiments, the at least one load detection circuit may be further configured to in response to the detection that the storage medium is not connected to the at least one signal output circuit, send a second disconnecting signal to the at least one first or gate to control the at least one first or gate to transmit a disconnecting signal to the at least one switch.

In some embodiments, the at least one load detection circuit and the at least one signal extraction circuit may be further configured to in response to the detection that the storage medium is not connected to the at least one signal output circuit and no reverse control signal from the first connection, send a first closing signal to the at least one first or gate, and send a second closing signal to the at least one first or gate.

In some embodiments, the at least one first or gate may be further configured to control the at least one switch to close upon receiving the first closing signal and the second closing signal.

In some embodiments, the system may further comprise at least one second or gate connecting the plurality of signal extraction units and the at least one signal superimposing circuit.

In some embodiments, the at least one signal extraction circuit may be further configured to control the at least one second or gate to breakover to transmit the reverse control signal to the at least one signal superimposing circuit.

In some embodiments, each of the at least one signal extraction circuit may include a comparator circuit including a non-inverting input port, an inverting input port, and an output port. The non-inverting input terminal may be connected to a corresponding signal output circuit of the at least one signal output circuit. The inverting input terminal may be connected to a predetermined reference signal input port. The output terminal may be connected to a corresponding signal superimposing circuit of the at least one signal superimposing circuit.

In some embodiments, the at least one signal superimposing circuit may include a first resistor, a second resistor, and a first triode. A first terminal of the first resistor may be connected to each of the at least one signal extraction circuit, and a second terminal of the first resistor is connected to a base terminal of the first triode. A collector electrode of the first triode may be connected to a first voltage input port, and an emitter electrode of the first triode may be connected to a first terminal of the second resistor. A second terminal of the second resistor may be connected to the signal input circuit.

In some embodiments, each of the at least one load detection circuit may include a first capacitor, a second capacitor, a third resistor and a fourth resistor. A first terminal of the first capacitor may be connected to a first terminal of a corresponding switch, and a second terminal of the first capacitor may be connected to a first terminal of the third resistor, a first terminal of the fourth resistor and the signal output circuit respectively. A second terminal of the third resistor may be connected to a second voltage input port. A second terminal of the fourth resistor may be connected to a first terminal of the second resistor and a second terminal of the corresponding switch respectively. A second terminal of the second resistor may be ground connected.

BRIEF DESCRIPTION OF THE DRAWINGS

The present disclosure is further described in terms of exemplary embodiments. These exemplary embodiments are described in detail with reference to the drawings. The drawings are not to scale. These embodiments are non-limiting exemplary embodiments, in which like reference numerals represent similar structures throughout the several views of the drawings, and wherein.

DETAILED DESCRIPTION

Figure 1:
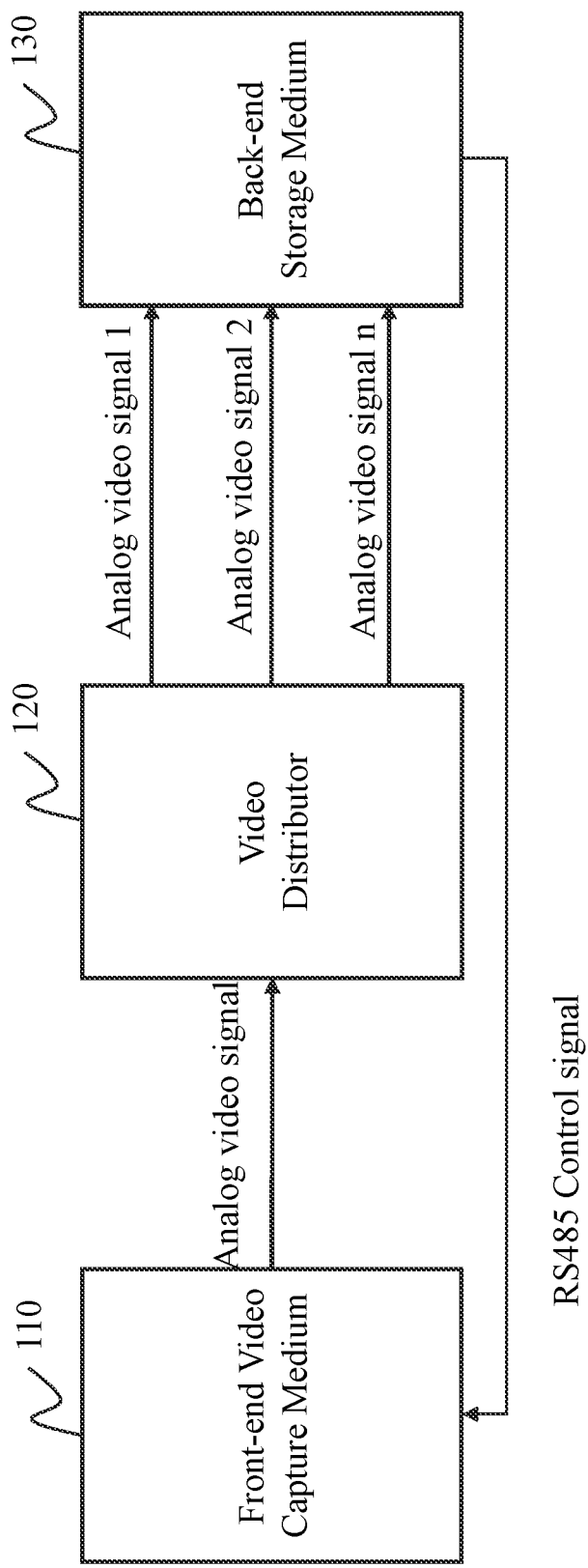
FIG. 1 is a block diagram illustrating a video signal distribution system.

In the following detailed description, numerous specific details are set forth by way of examples in order to provide a thorough understanding of the relevant disclosure. However, it should be apparent to those skilled in the art that the present disclosure may be practiced without such details. In other instances, well known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular example embodiments only and is not intended to be limiting. As used herein, the singular forms "a," "an," and "the" may be intended to include the plural forms as well, unless the context clearly indicates otherwise. It will be further understood that the terms "comprise," "comprises," and/or "comprising," "include," "includes," and/or "including," when used in this specification, specify the presence of stated features, integers, steps, operations, elements, and/or components, but do not preclude the presence or addition of one or more other features, integers, steps, operations, elements, components, and/or groups thereof.

It will be understood that the term "system," "unit," "circuit," and/or "block" used herein are one method to distinguish different components, elements, parts, section or assembly of different level in ascending order. However, the terms may be displaced by other expression if they achieve the same purpose.

Generally, the word "circuit," "unit," or "block," as used herein, refers to logic embodied in hardware or firmware, or to a collection of software instructions. A circuit, a unit, or a block described herein may be implemented as software and/or hardware and may be stored in any type of non-transitory computer-readable medium or other storage device. In some embodiments, a software circuit/unit/block may be compiled and linked into an executable program. It will be appreciated that software circuits can be callable from other circuits/units/blocks or from themselves, and/or may be invoked in response to detected events or interrupts. In general, the circuits/units/blocks described herein refer to logical circuits/units/blocks that may be combined with other circuits/units/blocks or divided into sub-circuits/sub-units/sub-blocks despite their physical organization or storage.

It will be understood that when a unit, engine, circuit or block is referred to as being "on," "connected to," or "coupled to," another unit, engine, circuit, or block, it may be directly on, connected or coupled to, or communicate with the other unit, engine, circuit, or block, or an intervening unit, engine, circuit, or block may be present, unless the context clearly indicates otherwise. As used herein, the term "and/or" includes any and all combinations of one or more of the associated listed items.

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

Figure 2:
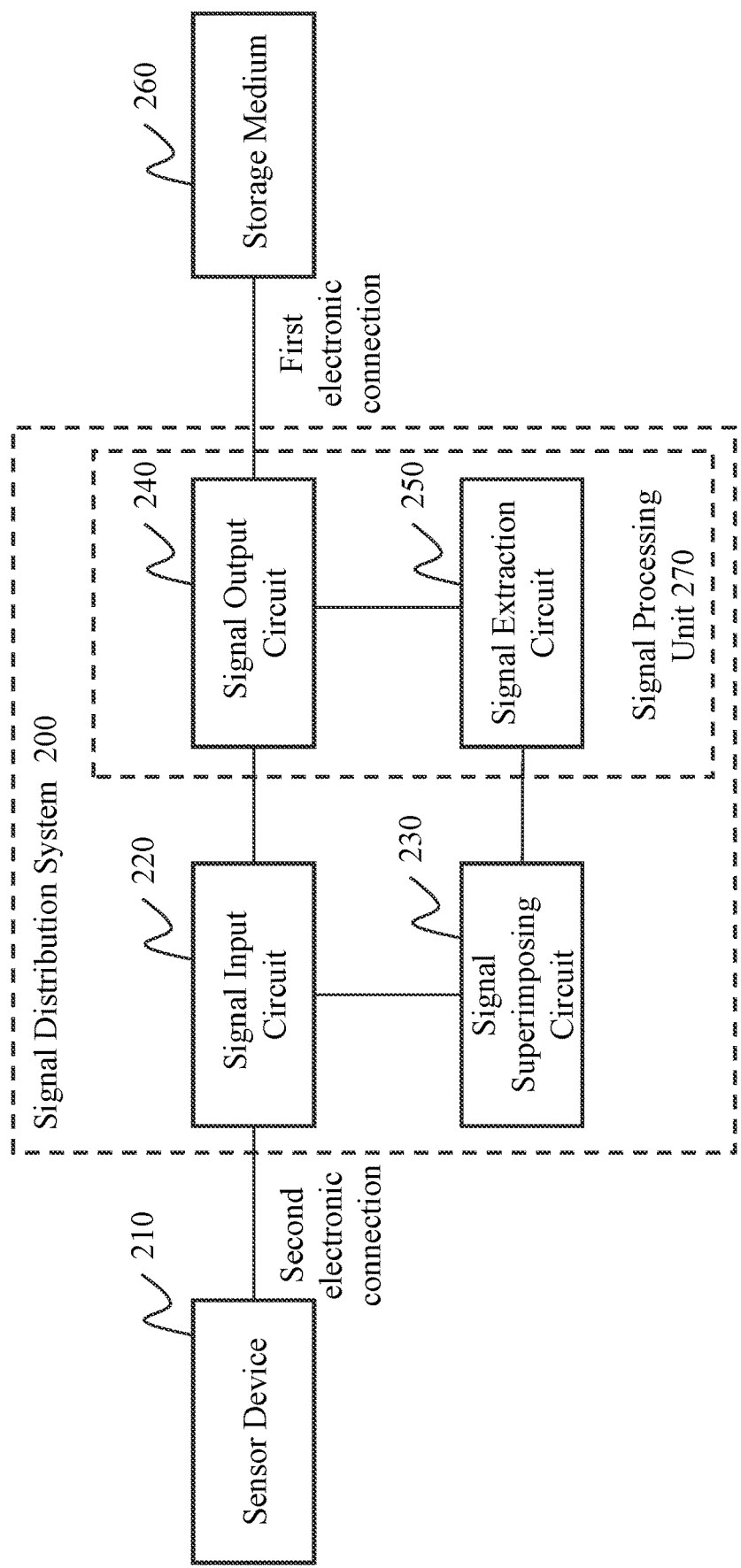
FIG. 2 is a block diagram illustrating an exemplary signal distribution system according to some embodiments of the present disclosure.

FIG. 2 is a block diagram illustrating an exemplary signal distribution system according to some embodiments of the present disclosure. The signal distribution system 200 may include a signal input circuit 220, a signal superimposing circuit 230, and at least one signal processing unit 270. For multiple signal processing units 270, each signal processing unit 270 may form a parallel connection with the other circuits included in the signal distribution system 200. For illustration purpose, in the relevant description of the present disclosure, the structure of the signal distribution system 200 corresponding to different signal processing unit 270 may be stated firstly about a single signal processing unit and further about the parallel connection of the signal extraction circuits 270. Each of the at least one signal processing unit 270 may include a signal output circuit 240, and a signal extraction circuit 250.

The signal output circuit 240 may be connected to a storage medium 260 via a first electronic connection. The signal input circuit 220 may be connected to a sensor device 210 via a corresponding second electronic connection. As used herein, the first electronic connection and/or the second electronic connection may be tangible electronic connections such as cables electronic connections (i.e., electronic connections via a first cable and a second cable, respectively), etc. The cable may include an AC cable, a DC cable, a coaxial cable, etc. The first electronic connection and/or the second electronic connection may also include an intangible connection to transmit electronic or electromagnetic signals. For example, the electronic connection may be a wireless communication such as an electromagnetic communication, etc. The electromagnetic communication may include a WIFI communication, a NFC communication, etc.

In some embodiments, the signal output circuit 240 may be connected to the signal extraction circuit 250. The signal extraction circuit 250 may be configured to detect whether a reverse control signal is transmitted from the first electronic connection. In response to a detection of a reverse control signal transmitted from the first electronic connection, the signal extraction circuit 250 may extract the reverse control signal, and further transmit the reverse control signal to the signal superimposing circuit 230. For example, in the event that the electronic connection is a coaxial cable (e.g., a first coaxial cable), the signal extraction circuit 250 may measure and extract the reverse control signal from the coaxial cable, and then transmit the reverse control signal to the signal superimposing circuit 230.

The signal extraction circuit 250 may be connected to the signal superimposing circuit 230. The signal superimposing circuit 230 may be connected to the signal input circuit 220. The signal input circuit 220 may be connected to the sensor device 210 via the second electronic connection (e.g., a second coaxial cable). In some embodiments, the signal superimposing circuit 230 may be configured to superimpose the received reverse control signal, and further send the superimposed reverse control signal to the sensor device 210 via the signal input circuit 220.

In some embodiments, the sensor device 210 may be a camera. The camera may capture image/video information via its CCD component or CMOS component, and send the image/video information to the signal distribution system 200 for further processing. In some embodiments, the storage medium 260 may include a digital video recorder (DVR). The digital video recorder may record image/video information in a digital format to a disk drive, a USB flash drive, a SD memory card, a SSD or other local or networked mass storage device. As used herein, the digital video recorder may also transmit the reverse control signal to the signal output circuit 240 via the first electronic connection.

The sensor device 210 may send a signal to the storage medium 260 via the signal distribution system. The signal may include an analog video signal, a digital video signal, etc. The storage medium 260 may send a reverse control signal to the sensor device 210 via the signal distribution system. In order to avoid adding additional cables and enable the signal distribution system 200 to satisfy a coaxial control function, the signal distribution system 200 may include the signal extraction circuit 250. The signal distribution system 200 may include the signal processing unit 270 which includes the signal output circuit 240. The signal output circuit 240 may be connected to the storage medium 260 through the corresponding first electronic connection. The storage medium 260 may transmit the reverse control signal to the sensor device 210 through the first electronic connection (e.g., the first coaxial cable) and the second electronic connection (e.g., the second coaxial cable).

For demonstration purposes, the present disclosure is described herein by way of example with reference to the signal output circuit 240. However, it is understood that the principle of the present disclosure may be applied to a plurality of signal output circuits 240 as well. As shown in FIG. 2, the signal output circuit 240 may be connected to the storage medium 260 through the corresponding first electronic connection. The storage medium 260 may transmit the reverse control signal to the signal output circuit 240 through the corresponding first electronic connection. The signal output circuit 240 may be connected to a corresponding signal extraction circuit 250. The signal extraction circuit 250 may determine whether the reverse control signal is transmitted from the corresponding first electronic connection. Since the reverse control signal may have a voltage value greater than a preset voltage threshold, the signal extraction circuit 250 may identify a voltage value of an output signal by the signal output circuit 240 to determine whether the reverse control signal is transmitted from the first electronic connection. If the voltage value of the output signal by the signal output circuit 240 is determined to be greater than the preset voltage threshold, the signal extraction circuit 250 may identify that there is a reverse control signal transmitted from the first electronic connection. The signal extraction circuit 250 may then extract the reverse control signal.

In reality, the reverse control signal sometimes cannot be transmitted to the sensor device 210 because of a poor signal drive capability of the signal extraction circuit 250. To ensure that the signal extraction circuit 250 transmits the reverse control signal to the sensor device 210, in some embodiments, the signal distribution system 200 may include the signal superimposing circuit 230 connecting the signal input circuit 220 and the signal extraction circuit 250 to superimpose the reverse control signal. The extraction circuit 250 may be connected to the signal superimposing circuit 230. The signal superimposing circuit 230 may be connected to the signal input circuit 220. The signal input circuit 220 may be connected to the sensor device 210 through the second electronic connection.

In some embodiments, the signal extraction circuit 250 may firstly transmit the reverse control signal to the signal superimposing circuit 230. The signal superimposing circuit 230 may perform superposition processing on the received reverse control signal, and further send the superimposed reverse control signal to the sensor device 210 via the signal input circuit 220. Because of the higher signal drive capability of the signal superimposing circuit 230, the intensity of the reverse control signal may be enhanced by the signal superimposing circuit 230 to ensure that the reverse control signal can be transmitted to the sensor device 210.

According to some embodiments of the present disclosure, the signal extraction circuit 250 may detect whether the reverse control signal is transmitted from the first electronic connection. In response to a detection of the reverse control signal transmitted form the first electronic connection, the signal extraction circuit 250 may send the reverse control signal to the signal superimposing circuit 230. The signal superimposing circuit 230 may perform superposition processing on the received reverse control signal, and further send the superimposed reverse control signal to the sensor device 210 via the signal input circuit 220. Therefore, the signal distribution system 200 proposed in the present disclosure may satisfy the coaxial control function.

In some embodiments, when the signal superimposing circuit 230 transmits the superimposed reverse control signal to the sensor device 210 via the signal input circuit 220, it may transmit the superimposed reverse control signal to the signal output circuit 240 via the signal input circuit 220. The signal output circuit 240 may further transmit the reverse control signal to the signal extraction circuit 250. Thereby, the reverse control signal may form a closed loop. The formation of the closed loop may cause inaccuracy of the reverse control extraction by the signal extraction circuit 250. In order to avoid the formation of the closed loop, a processing unit 330 may further include a first switch 320.

Figure 3A:
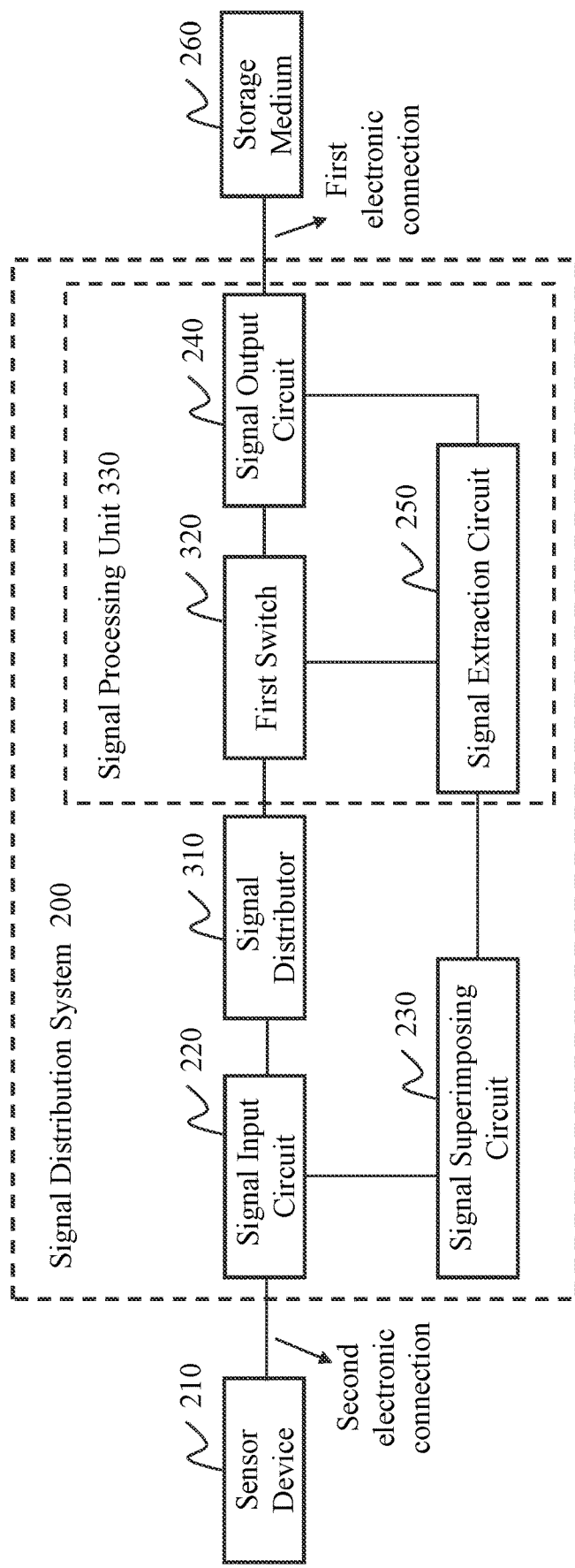
FIG. 3A is a block diagram illustrating an exemplary signal distribution system according to some embodiments of the present disclosure.

FIG. 3A is a block diagram illustrating the exemplary signal distribution system according to some embodiments of the present disclosure. The signal distribution system 200 may further include the first switch 320 in the processing unit 330 and a signal distributor 310.

The signal distributor 310 may be connected to the signal input circuit 220 and the first switch 320. The first switch 320 may be connected to the signal output circuit 240. The signal distributor 310 may be configured to output an input signal to the corresponding signal output circuit 240. As used herein, the input signal refers to the signal generated by the sensor device 210.

In some embodiments, the first switch 320 may be a, digital switch and/or an analog switch, etc. Taking the analog switch as an example, the first switch 320 may include an input terminal, an output terminal and a control terminal (e.g., at least one input port, at least one output port, and at least one control port). The input terminal of the first switch 320 may be connected to the signal distributor 310. The output terminal of the first switch 320 may be connected to the signal output circuit 240. The control terminal of the first switch 320 may be connected to the signal extraction circuit 250.

In some embodiments, if the signal extraction circuit 250 detects a reverse control signal transmitted from the corresponding first electronic connection, the signal extraction circuit 250 may control the corresponding first switch 320 to open to disconnect the connection between the signal distributor 310 and the signal output circuit 240.

In some embodiments, the signal distribution system 200 may further include the signal distributor 310 and the first switch 320. The signal distributor 310 may be connected to the signal input circuit 220. The signal input circuit 220 may send the input signal sent by the sensor device 210 to the signal distributor 310. The signal distributor 310 may be connected to first switch 320. The first switch 320 may be coupled to a signal output circuit 240. When the first switch 320 is closed, the signal distributor 310 may transmit the received input signal to the signal output circuit 240 through the first switch 320. When the first switch 320 is open, the signal superimposing circuit 230 may not transmit the superimposed reverse control signal to the corresponding signal output circuit 240 through the signal input circuit 220 and the signal distributor 310, thereby avoiding the reverse control signal from forming a closed loop.

Figure 3B:
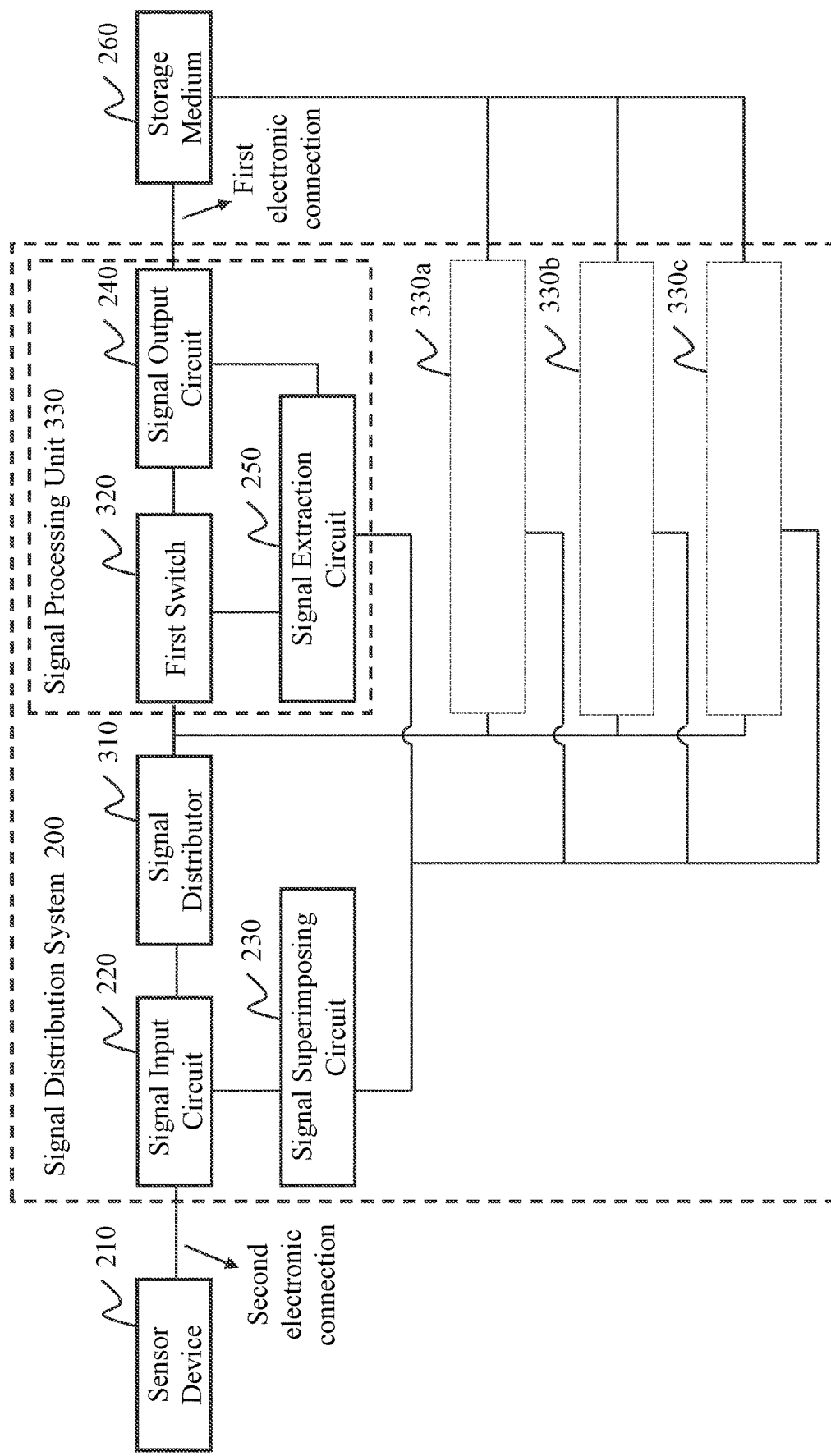
FIG. 3B is a block diagram illustrating an exemplary signal distribution system according to some embodiments of the present disclosure.

FIG. 3B is a block diagram illustrating an exemplary signal distribution system according to some embodiments of the present disclosure. As shown in the figure, the signal distribution system 200 may include multiple processing units in parallel connection with the other circuits. For illustration purpose, the multiple processing units shown in the figure may include processing unit 330, processing unit 330a, processing unit 330b, processing unit 330c. However, the number of the multiple processing units are not limited. The processing unit 330a, processing unit 330b, processing unit 330c may be of the same as the structure of the processing unit 330 and may be connected to the signal distributor in the same manor, and thereby the structure of which is omitted. For example, the processing unit 330a may also include a first switch, a signal output circuit and a signal extraction circuit with same internal connection as the processing unit 330. Alternatively, the processing units 330, 330a, 330b, and 330c may be of different electronic structures but may perform substantially the same functions so that they may be used in the same electronic circuits as shown in FIG. 3B.

The first switch of the processing unit 330a may be connected to the signal distributor. The signal output circuit 240 of the processing unit 330a may be connected to the storage medium with another first electronic connection. The signal extraction circuit of the processing unit 330a may be connected to the signal superimposing circuit 230. In some embodiments, each of the processing units may be operated separately. The signal distributor 310 may distribute the input signal to any of the multiple processing units. Any of the multiple processing units may extract their corresponding reverse control signal and further transmit it into the signal superimposing circuit 230.

Figure 4:
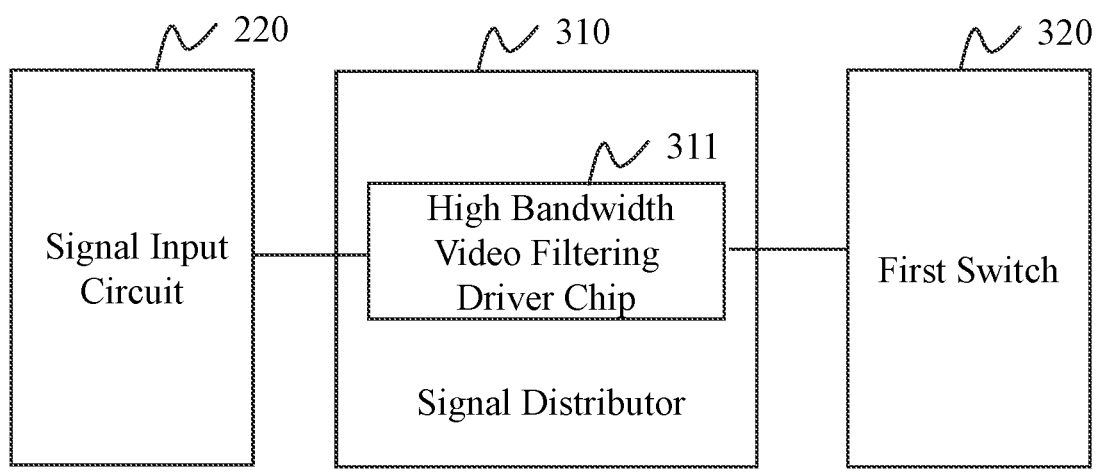
FIG. 4 is a block diagram illustrating a portion of an exemplary signal distribution system according to some embodiments of the present disclosure.

FIG. 4 is a block diagram illustrating a portion of an exemplary signal distribution system according to some embodiments of the present disclosure. The signal distributor 310 may include at least one high bandwidth video filtering driver chip 311. The number of the high bandwidth video filtering driver chips 311 may be equal to the number of the signal extraction circuits 250 (not shown in the figure). Each high bandwidth video filtering driver chip 311 may be connected to the signal input circuit 220 and a corresponding first switch 320 respectively. Each of the at least one first switch 320 may be connected to a corresponding signal output circuit 240 (not shown in the figure).

The high bandwidth video filtering driver chip 311 may receive an analog video signal transmitted from the signal input circuit 220, and output the analog video signal to the corresponding signal output circuit 240. The high bandwidth video filtering driver chip 311 may be, for example, SGM8063, which has a bandwidth up to 500 M and may satisfy the transmission requirements of analog video signals of all standards.

Figure 5:
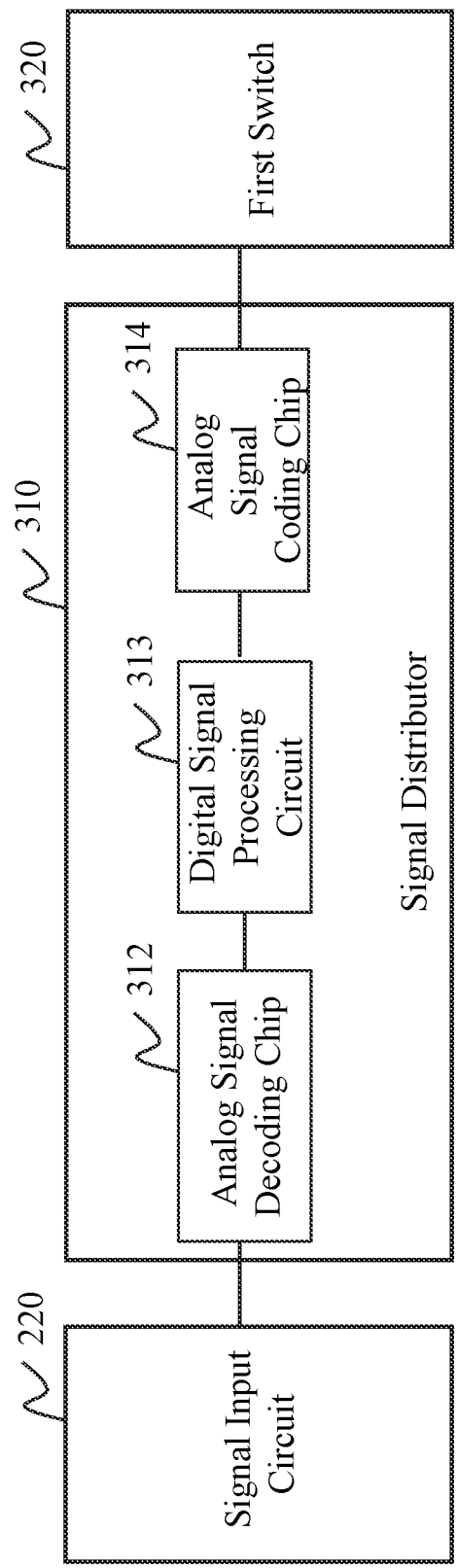
FIG. 5 is a block diagram illustrating a portion of an exemplary signal distribution system according to some embodiments of the present disclosure.

FIG. 5 is a block diagram illustrating a portion of an exemplary signal distribution system according to some embodiments of the present disclosure. The signal distributor 310 may include an analog signal decoding chip 312, a digital signal processing circuit 313, and at least one analog signal coding chip 314. The number of the analog signal coding chip 314 may be equal to the number of the multiple processing units.

The analog signal decoding chip 312 may be connected to the signal input circuit 220 and the digital signal processing circuit 313 respectively. The analog signal decoding chip 312 may be configured to receive an analog video signal transmitted from the signal input circuit 220, convert the analog video signal into a digital video signal, and send the digital video signal to the digital signal processing circuit 313. The digital signal processing circuit 313 may be connected to the each of the at least one analog signal coding chip 314 to send the digital video signal to each of the at least one analog signal coding chip 314. Each analog signal coding chip 314 may further be connected to a corresponding first switch 320 of a processing unit. The first switch 320 may be connected to a corresponding signal output circuit 240. The analog video signal may be further transmitted to the corresponding signal output circuit 240.

Figure 6:
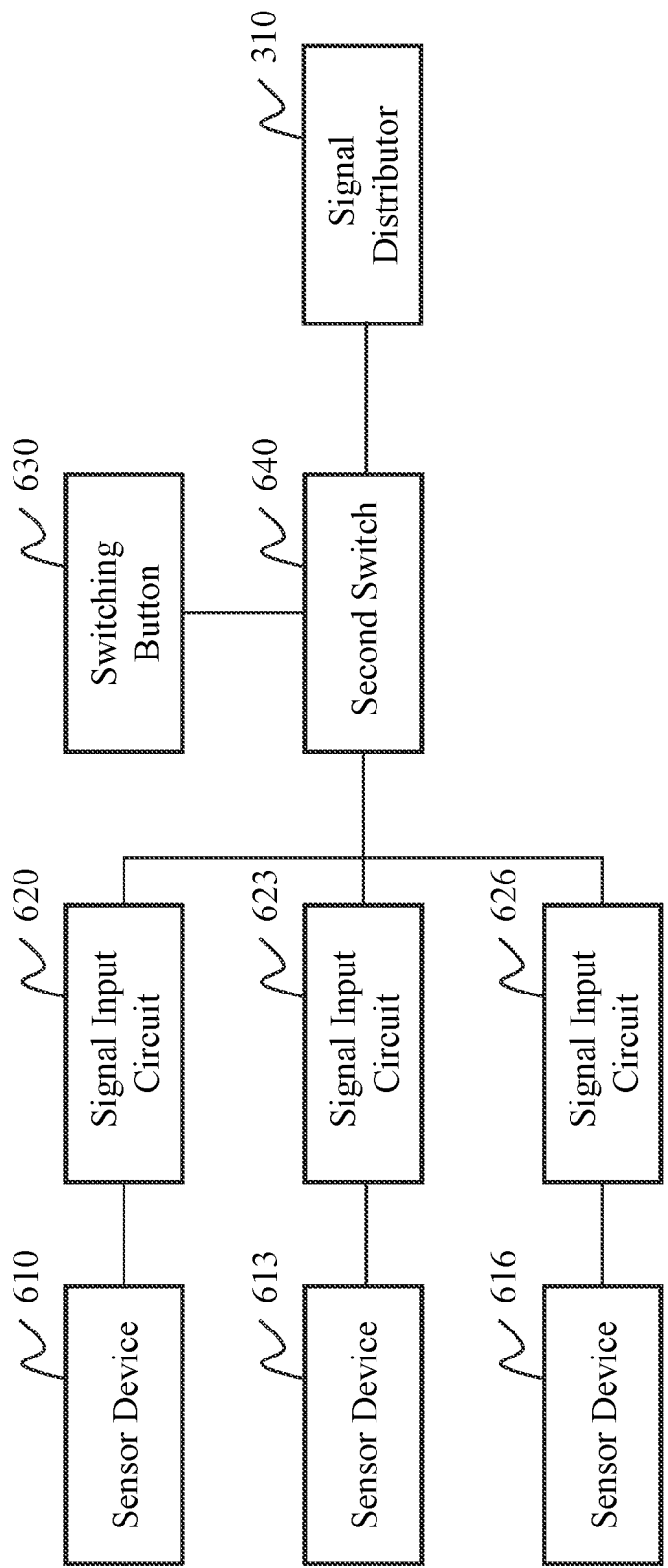
FIG. 6 is a block diagram illustrating an exemplary signal distribution system according to some embodiments of the present disclosure.

In addition, the signal distribution system 200 may include one or more signal input circuits according to some embodiments of the present disclosure. As shown in FIG. 6, the signal distribution system 200 may include a signal input circuit 620 connecting to a sensor device 610, a signal input circuit 623 connecting to a sensor device 613 and a signal input circuit 626 connecting to a sensor device 616, a second switch 640 and a switching button 630.

In some embodiments, the second switch 640 may be an analog switch including an input terminal, an output terminal and a control terminal (e.g., at least one input port, at least one output port, and at least one control port). The input terminal of the second switch 640 may be connected to the one or more signal input circuits. The output terminal of the second switch 640 may be connected to the signal distributor 310. The control terminal of the second switch 640 may be connected to the switching button 630.

The signal input circuit 620, the signal input circuit 623, and the signal input circuit 626 may be connected to sensor devices respectively. Each signal input circuit may be connected to the second switch 640. The second switch 640 may further be connected to the switching button 630 and the signal distributor 310. The switching button 630 may control the second switch 640 to determine which sensor device may transmit the input signal to the signal distributor 310. For example, a user may determine which sensor device may transmit an input signal to the signal distributor 310 by pressing the switching button 630. Since the switching button 630 is connected to the second switch 640, when the user determines a target sensor device to transmit the input signal to the signal distributor 310, the second switch 640 may be switched by the switching button 630 to a target signal input circuit corresponding to the target sensor device. At this time, the target signal input circuit may communicate with the signal distributor 310 through the second switch 640. The target signal input circuit may receive the input signal transmitted from the target sensor device and send the input signal to the signal distributor 310.

Figure 7A:
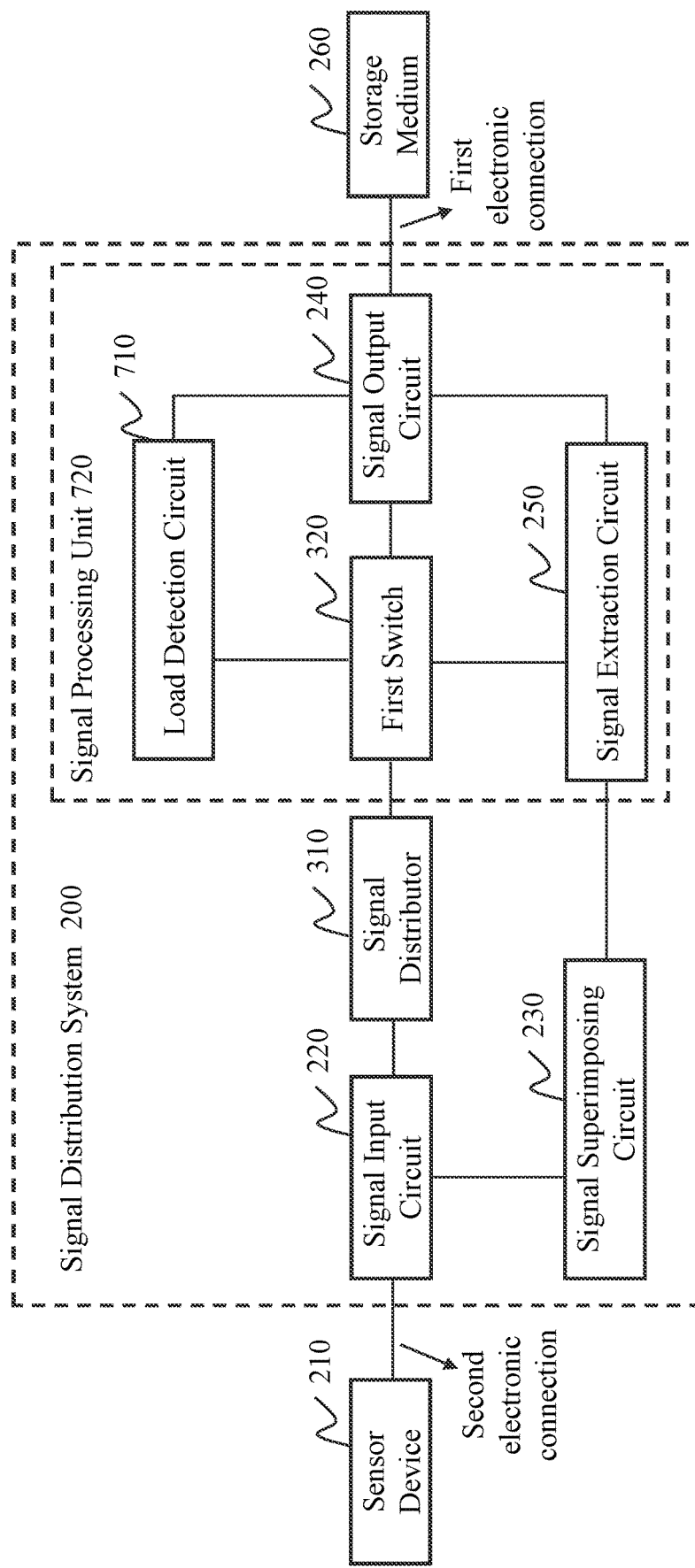
FIG. 7A is a block diagram illustrating an exemplary signal distribution system according to some embodiments of the present disclosure.

FIG. 7A is a block diagram illustrating an exemplary signal distribution system according to some embodiments of the present disclosure. The signal processing unit 720 may further include a load detection circuit 710.

The load detection circuit 710 may be connected to the signal output circuit 240 and the first switch 320 of the processing unit 720. The load detection circuit 710 may be configured to detect whether the signal output circuit 240 is connected to the storage medium 260. In response to a detection that the signal output circuit 240 is not connected to the storage medium 260, the load detection circuit 710 may control the first switch 320 to be open to disconnect the connection between the signal distributor 310 and the signal output circuit 240.

In some embodiments, the signal output circuit 240 may receive an input signal sent from the signal distributor 310 and the reverse control signal sent from the storage medium 260. The signal extraction circuit 250 may extract the reverse control signal from a mixed signal including the input signal and the reverse control signal output by the signal output circuit 240. The signal extraction circuit 250 may extract the reverse control signal according to a voltage value of the mixed signal.

The voltage value of the input signal sent from the sensor device 210 may be a specified value. If the signal output circuit 240 is not connected to the storage medium 260, the sensor device 210 and the signal distributor 310 cannot form an electric path with the storage medium 260, therefore, the storage medium 260 may not take and/or assume any voltage, i.e., there may not have a voltage difference appear on the storage medium 260. In other words, the storage medium 260 may not have a "voltage division" effect to the system. The voltage value of the mixed signal output by the signal output circuit 240 may be equal to the voltage value of the input signal sent from the sensor device 210. If the signal output circuit 240 is connected to the storage medium 260, as the sensor device 210 and the signal distributor 310 form an electric path with the storage medium 260, the voltage division of the storage medium 260 may cause the voltage value of the mixed signal smaller than the specified voltage value of the input signal, if the storage medium 260 does not send the reverse control signal to the signal output circuit 240. Since the signal distribution system 200 is connected to the storage medium 260, the storage medium 260 may send the reverse control signal to the sensor device 210 via the signal distribution system. The voltage value of the reverse control signal may be close to the voltage value of the input signal sent from the sensor device 210.

When the signal distribution system 200 is connected to the storage medium 260 and the storage medium 260 does not send the reverse control signal, the voltage division of the storage medium 260 may cause the voltage value output by the signal output circuit 240 to be smaller than the voltage value of the video signal sent by the sensor device 210. If the storage medium 260 sends the reverse control signal to the sensor device 210 via the signal distribution system, as the voltage value of the reverse control signal may be close to the voltage value of the input signal sent from the sensor device 210, the signal output circuit 240 may output the mixed signal with a relatively high voltage value. The relatively high voltage value may be the voltage value of the reverse control signal. At this time, the signal extraction circuit 250 may extract a correct reverse control signal. The signal extraction circuit 250 may determine whether the reverse control signal is transmitted from the first electronic connection according to the voltage value of the mixed signal.

If the signal distribution system 200 is not connected to the storage medium 260 and the storage medium 260 does not send a reverse control signal, the voltage value of the signal output by the signal output circuit 240 may be the specific voltage value of the input signal. Since the voltage value of the input signal is close to the voltage value of the reverse control signal, the signal extraction circuit 250 may misjudge that a reverse control signal is transmitted from the first electronic connection. If the signal extraction circuit 250 receives the signal sent by the corresponding signal output circuit 240, the input signal may be mistakenly extracted as the reverse control signal by the signal extraction circuit 250.

The load detection circuit is used to avoid mistakenly extracting the input signal as the reverse control signal, the signal distribution system 200 may further include the load detection circuit 710. The number of the load detection circuit 710 may be equal to the number of the signal extraction circuit 250. If the load detection circuit 710 detects that a signal output circuit 240 is not connected to the storage medium 260, the load detection circuit 710 may control the first switch 320 to be open. The signal distributor 310 may then be disconnected from the signal output circuit 240, which may prevent the input signal from being sent to the signal extraction circuit 250. The signal extraction circuit 250 may not extract the input signal as the reverse control signal by mistake.

In some embodiments, the load detection circuit 710 may detect whether the signal output circuit 240 is connected to the storage medium 260 according to a voltage value of a node of the load detection circuit 710 connected to the signal output circuit 240. The voltage value of the node may be obtained by the load detection circuit 710. If the corresponding signal output circuit 240 is connected to the storage medium 260, an electric path may be formed including the load detection circuit 710, the signal output circuit 240, the first electronic connection and the storage medium 260. The voltage value of the node may be equal to a voltage division of the storage medium 260. If the signal output circuit 240 is not connected to the storage medium 260, the electric path including the load detection circuit 710, the corresponding signal output circuit 240, the corresponding first electronic connection, and the storage medium 260 may not be formed. The voltage value of the node may be greater than the voltage division of the storage medium 260. Therefore, a preset voltage value may be stored in the load detection circuit 710. The preset voltage value may be a voltage value greater than the voltage division of the storage medium 260. The load detection circuit 710 may determine whether the voltage value of the node is greater than the preset voltage value. When the voltage value of the node is determined greater than the preset voltage value, the load detection circuit 710 may determine that the signal output circuit 240 is not connected to the storage medium 260. When the voltage value of the node is determined not greater than the preset voltage value, the load detection circuit 710 may determine that the signal output circuit 240 is connected to the storage medium 260.

In response to the detection that the signal output circuit 240 is not connected to the storage medium 260, the load detection circuit 710 may control the first switch to be open. The signal distributor 310 may then be disconnected from the signal output circuit 240, which may prevent the input signal from being sent to the signal extraction circuit 250. Therefore, the signal extraction circuit 250 may not extract the input signal as a reverse control signal.

In some embodiments, in response to the detection that the storage medium 260 is connected to the storage medium, the load detection circuit 710 may send a first closing signal to the corresponding first switch 320. In response to the detection that the reverse control signal is not transmitted from the first electronic connection, the signal extraction circuit 250 may send a second closing signal to the corresponding first switch 320. The first switch 320 may be closed when receiving the first closing signal and the second closing signal. The input signal distributed by the signal distributor 310 may be transmitted to the corresponding signal output circuit 240 through the first switch 320.

In some embodiments, in response to the detection that the corresponding signal output circuit 240 is connected to the storage medium 260, a relatively high voltage value of the mixed signal output by the signal output circuit 240 may be the voltage value of the reverse control signal transmitted from the storage medium 260 via the first electronic connection. The signal extraction circuit 250 may not extract the input signal as the reverse control signal based on the voltage value of the signal output by the signal output circuit 240. Therefore, the load detection circuit 710 may send the first closing signal to the first switch 320. The signal extraction circuit 250 may detect whether the reverse control signal is transmitted from the first electronic connection. In response to a detection that the reverse control signal is not transmitted from the first electronic connection, the reverse control signal may not form a closed loop. The signal extraction circuit 250 may then send the second closing signal to the first switch 320.

The first switch 320 may then receive the first closing signal and the second closing signal. In order to avoid the signal extraction circuit 250 extracting the input signal as the reverse control signal and avoid the reverse control signal forming a closed loop, the first switch 320 may be closed only when the first closing signal and the second closing signal are received. After the first switch 320 is closed, the signal distributor 310, the corresponding first switch 320 and the corresponding signal output circuit 240 may form an electric path. The corresponding input signal distributed by the signal distributor 310 may be sent to the corresponding signal output circuit 240 through the first switch 320.

When the load detection circuit 710 determines that the first cable is connected to the storage medium 260, the first closing signal may be sent to the first switch 320. When the signal extraction circuit 250 detects that the reverse control signal is not transmitted from the first cable, the second closing signal may be sent to the corresponding first switch 320. When receiving the first closing signal and the second closing signal, the first switch 320 may be closed. In order to avoiding that the signal extraction circuit 250 mistakenly extracts the input signal as a reverse control signal and the reverse control signal forms a closed loop, the input signal distributed by the signal distributor 310 may be sent to the corresponding signal output circuit 240 through the first switch 320.

Figure 7B:
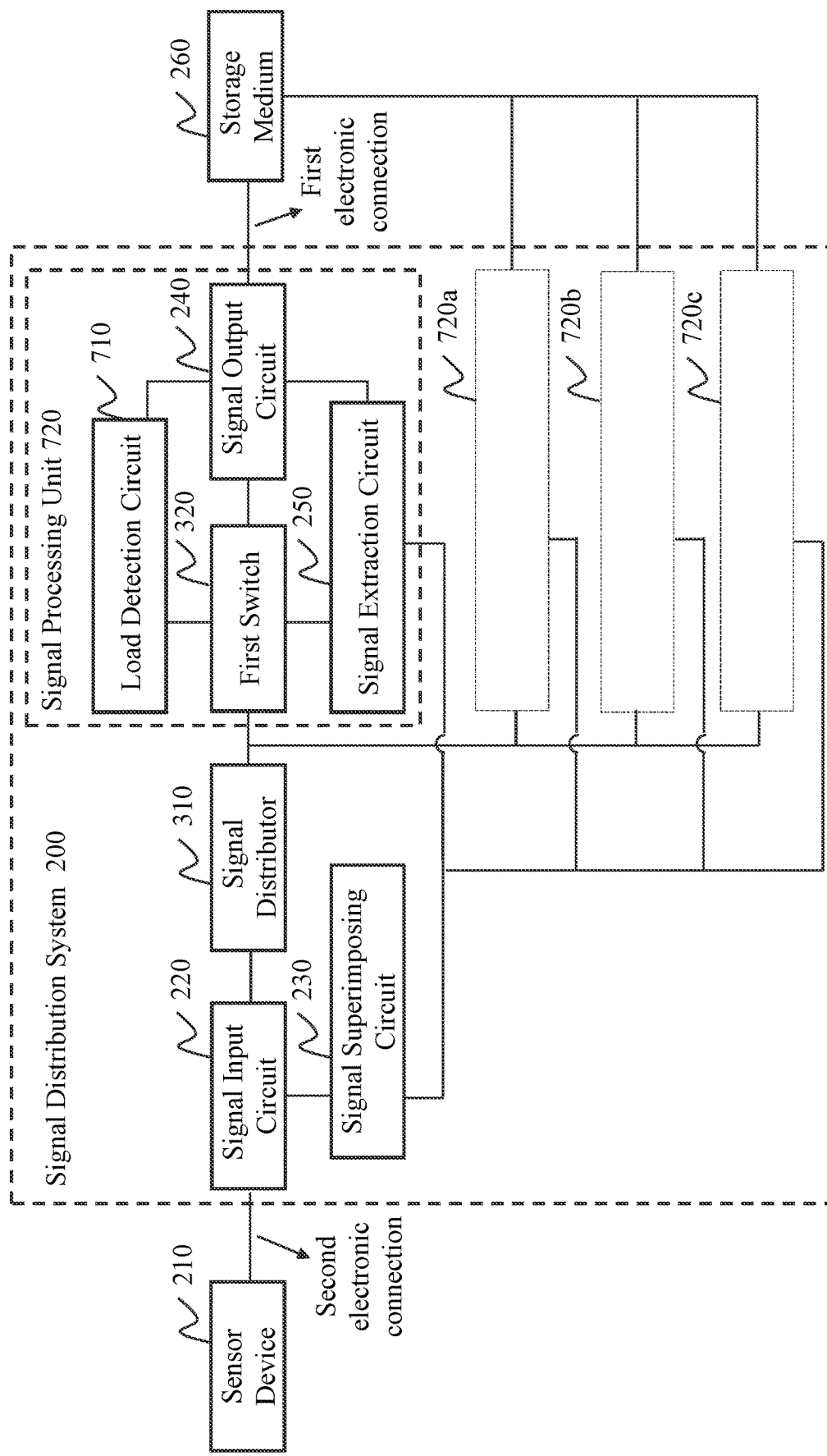
FIG. 7B is a block diagram illustrating an exemplary signal distribution system according to some embodiments of the present disclosure.

FIG. 7B is a block diagram illustrating an exemplary signal distribution system according to some embodiments of the present disclosure. As shown in FIG. 7B, the signal distribution system 200 may include multiple processing units in parallel connection with the other components of the signal distribution system 200. For illustration purpose, the multiple processing units shown in the figure may include processing unit 720, processing unit 720a, processing unit 720b, processing unit 720c. However, the number of the multiple processing units are not limited. Any number of the processing units may be adopted by the system. The system 200 may include any number of processing units as the actual need requires. The processing unit 720a, processing unit 720b, processing unit 720c may be of the same or substantially the same structure as the structure of the processing unit 720 and may be connected to the signal distributor in the same manor.

Therefore, the structure of the processing units 720a, 720b, and 720c are omitted. Merely by way of example, the processing unit 720a may also include a first switch, a signal output circuit, a load detection circuit and a signal extraction circuit with same internal connection as the processing unit 720. Alternatively, the processing units 720, 720a, 720b, and 720c may be of different electronic structures but may perform substantially the same functions so that they may be used in the same electronic circuits as shown in FIG. 7B.

The first switch of the processing unit 720a may be connected to the signal distributor 310. The signal output circuit of the processing unit 720a may be connected to the storage medium 260 with another first electronic connection. The load detection circuit of the processing unit 720a may be connected to the first switch of the processing unit 720a and the signal output circuit 240 separately. The signal extraction circuit of the processing unit 720a may be connected to the signal superimposing circuit 230. In some embodiments, each of the processing units may be operated separately. The signal distributor 310 may distribute the input signal to any of the multiple processing units. Any of the multiple processing units may extract their corresponding reverse control signal and further transmit it into the signal superimposing circuit 230.

Figure 8A:
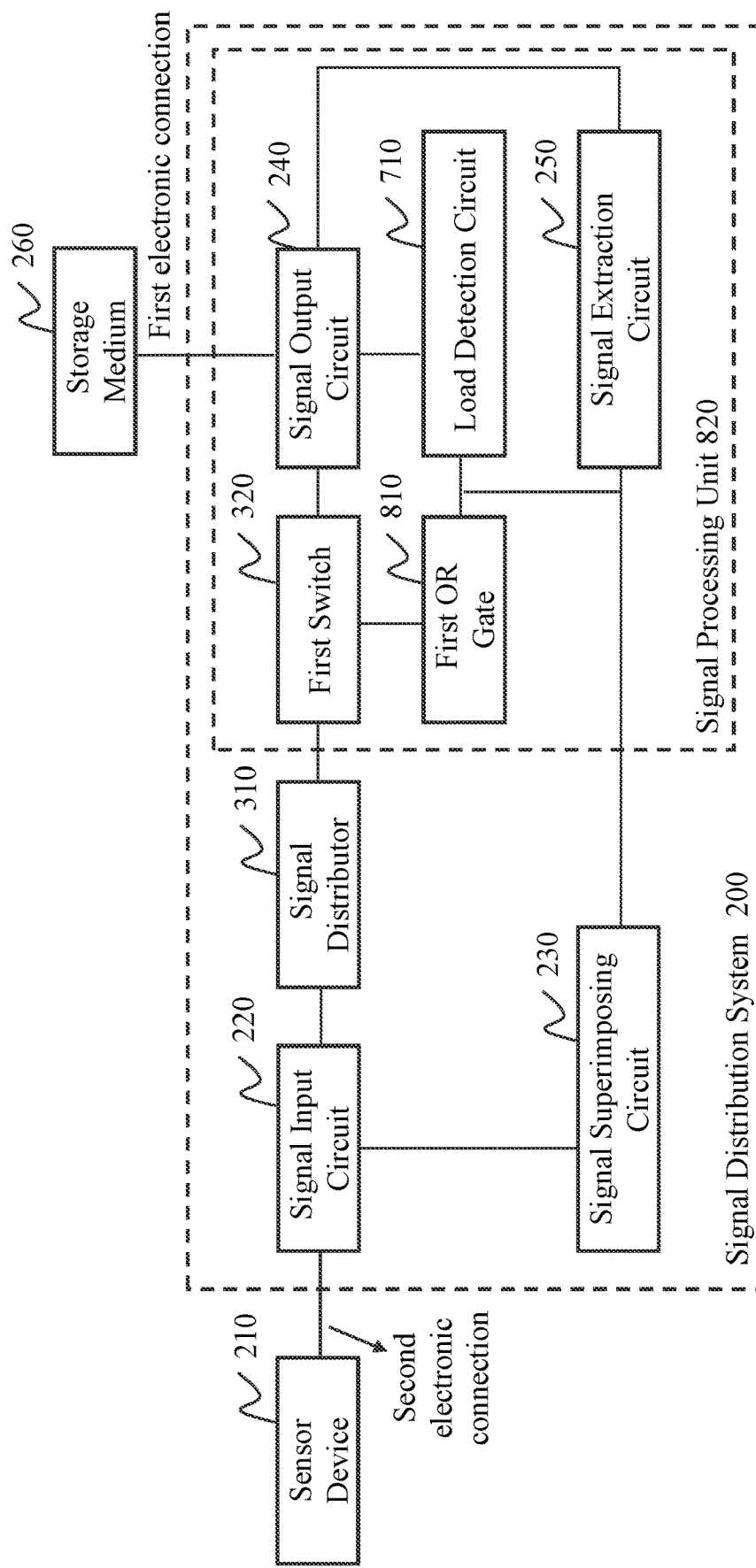
FIG. 8A is a block diagram illustrating an exemplary signal distribution system according to some embodiments of the present disclosure.

FIG. 8A is a block diagram illustrating an exemplary signal distribution system according to some embodiments of the present disclosure. In order to avoid that the signal extraction circuit 250 mistakenly extracts the input signal as the reverse control signal and the reverse control signal forms a closed loop, the signal processing unit 820 may further include a first OR gate 810.

Two input terminals of the first OR gate 810 may be connected to the signal extraction circuit 250 and the load detection circuit 710 respectively. An output terminal of the first OR gate 810 may be connected to the first switch 320. If the signal extraction circuit 250 determines that there is a reverse control signal transmitted from the first electronic connection, the signal extraction circuit 250 may send a first opening signal to the first OR gate 810. The first OR gate 810 may then send the first opening signal to the first switch 320 to control the first switch 320 to be open. The signal distributor 310 may then be disconnected from the signal output circuit 240.

If the load detection circuit 710 detects that the signal output circuit 240 is not connected to the storage medium 260, the load detection circuit 710 may send a second opening signal to the first OR gate 810. The first OR gate 810 may then send the second opening signal to the first switch 320 to control the first switch 320 to be open. The signal distributor 310 may then be disconnected from the corresponding signal output circuit 240.

If the load detection circuit 710 detects that the signal output circuit 240 is connected to the storage medium 260, the load detection circuit 710 may send the first closing signal to the first OR gate 810. If the signal extraction circuit 250 detects no reverse control signal transmitted from the corresponding first electronic connection, the signal extraction circuit 250 may send the second closing signal to the first OR gate 810. Upon receiving the first closing signal and the second closing signal, the first OR gate 810 may control the first switch 320 to be closed. The corresponding input signal distributed by the signal distributor 310 may then be sent to the signal output circuit 240 through the first switch 320.

In some embodiments, the signal distribution system 200 may further include the first OR gate 810. The first OR gate 810 may include two input ends and one output end. Two input ends of the first OR gate 810 may be connected to the signal extraction circuit 250 and the load detection circuit 710 respectively. One output end of the first OR gate 810 may be connected to the first switch 320.

The first OR gate 810 may receive the first opening signal sent by the signal extraction circuit 250 for controlling the first switch 320 to be open. The first OR gate 810 may also receive the second opening signal sent by the load detection circuit 710 for controlling the first switch 320 to be open. When the first OR gate 810 receives the second closing signal sent by the signal extraction circuit 250 and the first closing signal sent by the load detection circuit 710, the first switch 320 may be closed.

Specifically, the signal extraction circuit 250 may detect whether the reverse control signal is transmitted from the first cable. In response to a detection that the reverse control signal is transmitted from the corresponding first cable, a first high voltage level signal may be sent to the first OR gate 810. The first high voltage level signal may be the first opening signal. The first OR gate 810 may send the first opening signal to the first switch 320 for controlling the first switch 320 to be open. The load detection circuit 710 may detect whether the corresponding first cable is connected to the storage medium 260. In response to a detection that the first cable is not connected to the storage medium 260, a second high voltage level signal may be sent to the first OR gate 810. The second high voltage level signal may be the second opening signal. The first OR gate 810 may send the second opening signal to the first switch 320 for controlling the first switch 320 to be open.

Figure 8B:
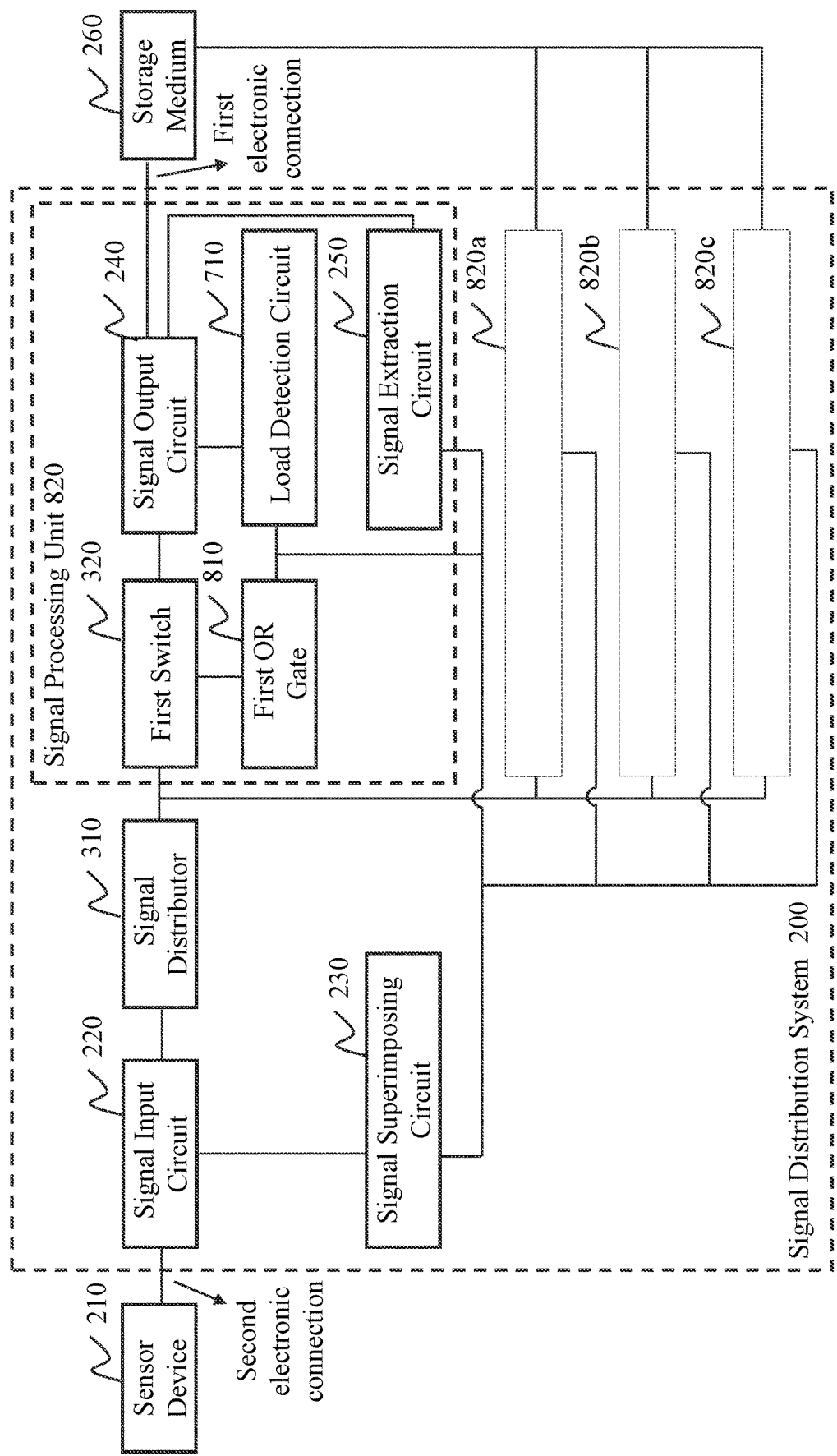
FIG. 8B is a block diagram illustrating an exemplary signal distribution system according to some embodiments of the present disclosure.

FIG. 8B is a block diagram illustrating an exemplary signal distribution system according to some embodiments of the present disclosure. As shown in the figure, the signal distribution system 200 may include multiple processing units in parallel connection with the other components of the signal distribution system 200. For illustration purpose, the multiple processing units shown in the figure may include processing unit 820, processing unit 820a, processing unit 820b, processing unit 820c. However, the number of the multiple processing units are not limited herein. Any number of the processing units may be adopted by the system. The system 200 may include any number of processing units as the actual need requires. The processing unit 720a, processing unit 720b, processing unit 720c may be of the same or substantially the same structure as the structure of the processing unit 720 and may be connected to the signal distributor in the same manor. Therefore, the structure of the processing units 720a, 720b, and 720c are omitted. For example, the processing unit 820a may also include a first switch, a signal output circuit, a load detection circuit, a first OR gate and a signal extraction circuit with same internal connection as the processing unit 720. Alternatively, the processing units 720, 720a, 720b, and 720c may be of different electronic structures but may perform substantially the same functions so that they may be used in the same electronic circuits as shown in FIG. 7B.

The first switch of the processing unit 820a may be connected to the signal distributor 310. The signal output circuit of the processing unit 820a may be connected to the storage medium 260 with another first electronic connection. The load detection circuit of the processing unit 820a may be connected to the first switch of the processing unit 820a and the signal output circuit 240 separately. The first OR gate of the signal processing unit 820a may be connected to the first switch and the load detection circuit of the processing unit 820a separately. The signal extraction circuit of the processing unit 720a may be connected to the signal superimposing circuit 230. In some embodiments, each of the processing units may be operated separately. The signal distributor 310 may distribute the input signal to any of the multiple processing units. Any of the multiple processing units may extract their corresponding reverse control signal and further transmit it into the signal superimposing circuit 230.

Figure 9:
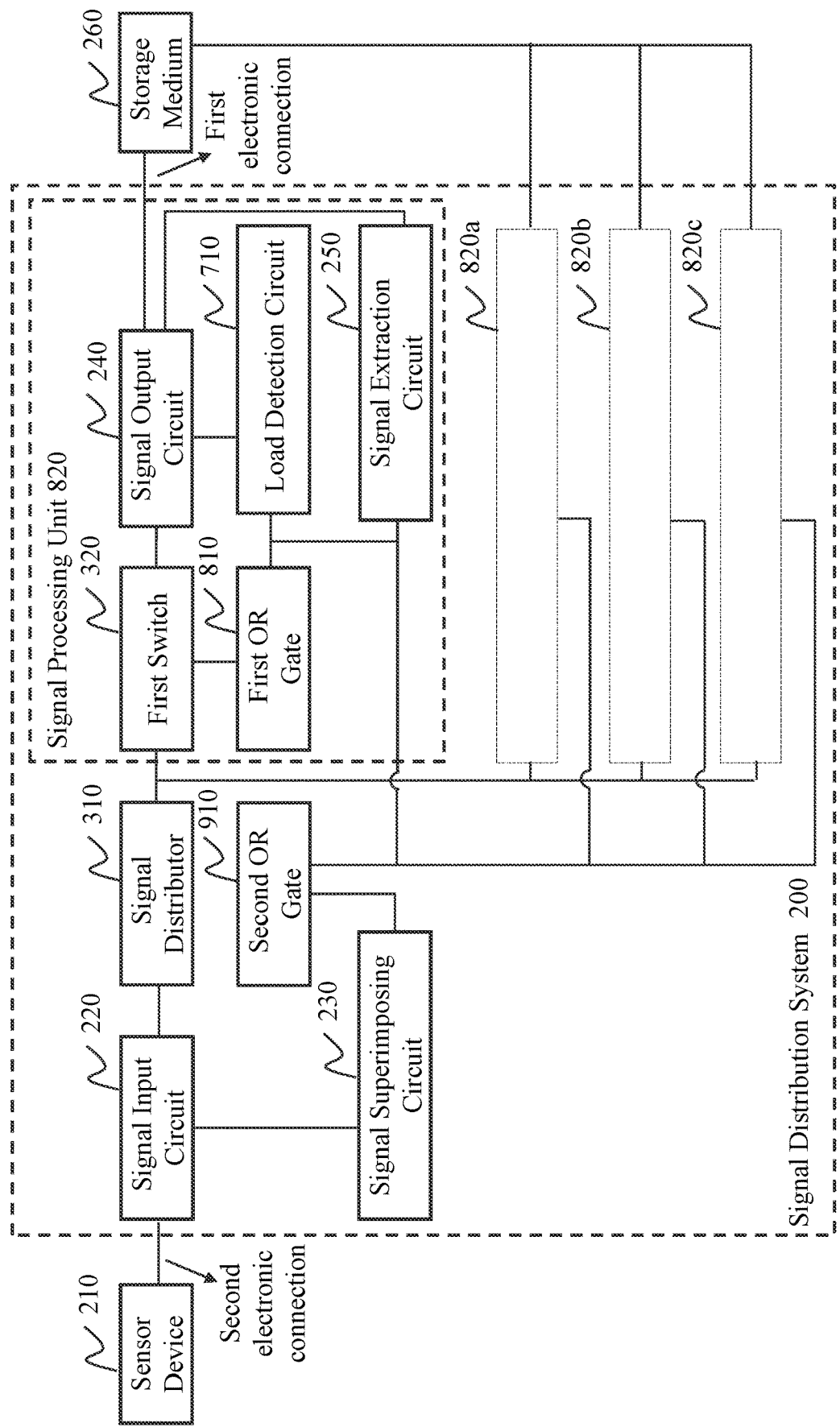
FIG. 9 is a block diagram illustrating an exemplary signal distribution system according to some embodiments of the present disclosure.

FIG. 9 is a block diagram illustrating an exemplary signal distribution system according to some embodiments of the present disclosure. As shown in the figure, the signal distribution system 200 may include multiple processing units in parallel connection with the other components of the signal distribution system 200. On the basis of the structure of the signal distribution system 200 as shown in FIG. 8B, the signal distribution system 200 may further include a second OR gate 910 to ensure that no matter which one of the multiple signal processing units extracts the reverse control signal, the reverse control signal may be transmitted to the signal superimposing circuit 230.

Taking the signal processing unit 820 as an example, an input terminal of the second OR gate 910 may be connected to the signal extraction circuit 250 of the signal processing unit 820. An output terminal of the second OR gate 910 may be connected to the signal superimposing circuit 230. When exacting the reverse control signal, the signal extraction circuit 250 may control the second OR gate 910 to be turned on and send the reverse control signal to the signal superimposing circuit 230 via the second OR gate 910.

In some embodiments, the signal distribution system 200 may further include the second OR gate 910. The number of the input ends of the second OR gate 910 may be equal to the number of the signal extraction circuit 250. Each input end of the second OR gate 910 may be connected to the corresponding signal extraction circuit 250. The output end of the second OR gate 910 may be connected to the signal superimposing circuit 230. Any one of the signal extraction circuits 250 in the signal distribution system may detect whether the reverse control signal is transmitted from the corresponding first cable. The reverse control signal may be extracted whenever the signal exaction circuit 250 detects that the reverse control signal is transmitted from the corresponding first cable. When extracting the reverse control signal, the second OR gate 910 may be closed, and the extracted reverse control signal may be sent to the signal superimposing circuit 230. Specifically, when extracting the reverse control signal, the signal extraction circuit 250 may send a high level signal to the second OR gate 910 to control the second OR gate 910 to be closed. It may ensure that when any one of the at least one signal extraction circuit 250 extracts the reverse control signal, the extracted reverse control signal may be sent to the superimposing circuit 230. Further, it is not necessary for each signal extraction circuit 250 to be connected to the signal superimposing circuit 230, so that the cable arrangement in the signal distribution system 200 may be more convenient.

It should be noted that other signal processing units of the signal distribution system 200 may be connected to the second OR gate 910. For example, the processing unit 820a may also be connected to the second OR gate 910 in parallel with the processing unit 820b, processing unit 820c, or other signal processing units. Structures of the processing unit 820a, processing unit 820b, processing unit 820c may be omitted since they are the same as the structure of the processing unit 820.

Figure 10:
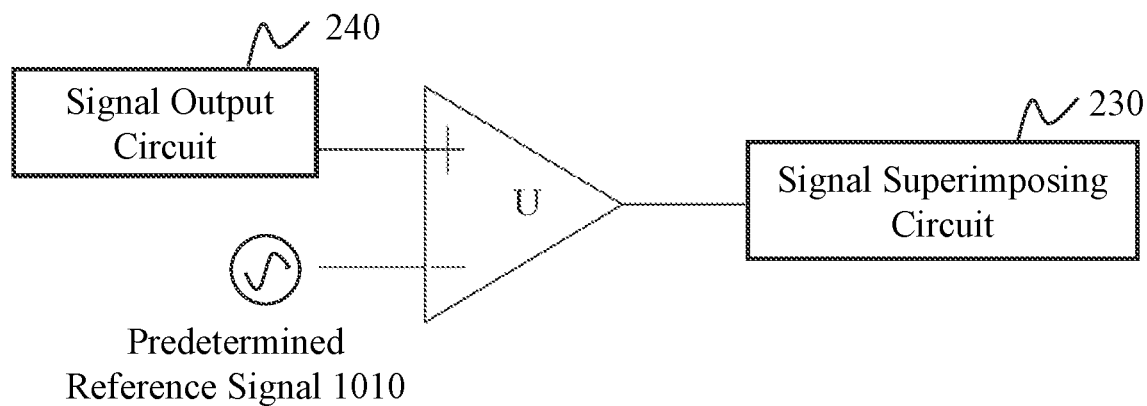
FIG. 10 is a circuit diagram illustrating an exemplary signal exaction circuit for extracting a reverse control signal according to some embodiments of the present disclosure.

FIG. 10 is a circuit diagram illustrating an exemplary signal exaction circuit for extracting a reverse control signal according to some embodiments of the present disclosure. The extraction of the reverse control signal may be implemented based on a software program or may be implemented by constructing a hardware circuit. As shown in FIG. 10, the signal extraction circuit 250 may include a comparator U.

A non-inverting input terminal of the comparator U may be connected to the corresponding signal output circuit 240. An inverting input terminal of the comparator U may be configured to receive a predetermined reference signal 1010. An output terminal of the comparator U may be connected to the signal superimposing circuit 230.

When the signal output circuit 240 is connected to the storage medium 260 through the corresponding first electronic connection, the signal output circuit 240 may receive the input signal sent from the signal distributor 310 and the reverse control signal sent from the storage medium 260 via the corresponding first electronic connection. The input signal and the reverse control signal may be transmitted to the non-inverting input terminal of the comparator U. The voltage value of the predetermined reference signal 1010 may be smaller than the voltage value of the reverse control signal.

As disclosed above, the storage medium 260 may send the reverse control signal to the sensor device 210 to reverse control the sensor device 210, such as standard switching, zooming in, zooming out, etc. When extracting the reverse control signal sent by the storage medium 260, the signal extraction circuit 250 may actually convert the reverse control signal may into a digital signal. The signal extraction circuit 250 may send the digital signal to the sensor device 210. The sensor device 210 may analyze the received digital signal to obtain a specific reverse control instruction. The sensor device 210 may then perform a corresponding operation according to the specific reverse control instruction.

Specifically, when the voltage value of the non-inverting input terminal of the comparator U is smaller than the voltage value of the inverting input terminal of the comparator U, the comparator U may output a low level signal. When the voltage value of the non-inverting input terminal of the comparator U is greater than the voltage value of the inverting input terminal of the comparator U, the comparator U may output a high level signal. In this way, the comparator U may convert the reverse control signal into the digital signal. The converted digital signal may be the extracted reverse control signal.

For example, the voltage value of the reverse control signal may be 1.8V. The voltage value of the predetermined reference signal may be 1.4V. When the voltage value (1.8V) of the non-inverting input terminal of the comparator U is greater than the voltage value (1.4V) of the inverting input terminal of the comparator U, the output terminal of the comparator U may output a high level signal. When the voltage value (e.g., 1V) of the non-inverting input terminal of the comparator U is smaller than the voltage value (1.4V) of the inverting input terminal of the comparator U, the output terminal of the comparator U may output a low level signal.

In addition, the signal extraction circuit 250 may also be connected to the corresponding first switch 320. The signal extraction circuit 250 may control the corresponding first switch 320 to be closed or open. Specifically, the output terminal of the comparator U may be connected to the corresponding first switch 320. When the signal extraction circuit 250 extracts the reverse control signal, the comparator U may output a high level signal. The high level signal may be the first opening signal sent by the signal extraction circuit 250 to the corresponding first switch 320. When the signal extraction circuit 250 does not extract the reverse control signal, the comparator U may output a low level signal. The low level signal may be the second closing signal sent by the signal extraction circuit 250 to the corresponding first switch 320.

Figure 11:
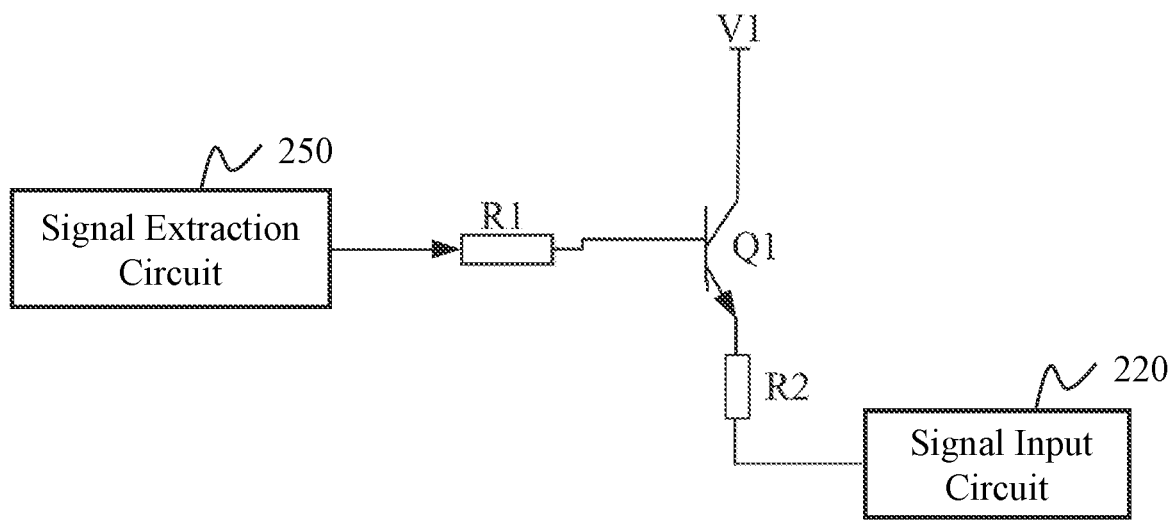
FIG. 11 is a circuit diagram illustrating an exemplary signal superimposing circuit for superimposing reverse control signal according to some embodiments of the present disclosure.

Since the signal drive capability of the signal extraction circuit 250 is not enough, it may not be possible to transmit the extracted reverse control signal to the sensor device 210. In order to ensure that the reverse control signal to be transmitted to the sensor device 210, the output terminal of the comparator U may be connected to the signal superimposing circuit 230. After the comparator U extracting the reverse control signal, the reverse control signal may be sent to the signal superimposing circuit 230 through the output terminal of the comparator U. The signal superimposing circuit 230 may perform superposition processing on the received reverse control signal, and further send the superimposed reverse control signal to the sensor device 210 through the signal input circuit 220. FIG. 11 is a circuit diagram illustrating an exemplary signal superimposing circuit for superimposing reverse control signal according to some embodiments of the present disclosure. As shown in FIG. 11, the signal superimposing circuit 230 may include a first resistor R1, a second resistor R2 and a first triode Q1.

A terminal of the first resistor R1 may be connected to each signal extraction circuit 250. The other terminal of the first resistor R1 may be connected to a base terminal of the first triode Q1.

A collector terminal of the first triode Q1 may be connected to a first voltage input terminal V1. An emitter terminal of the first triode Q1 may be connected to a terminal of the second resistor R2.

The other terminal of the second resistor R2 not connected to the emitter terminal of the first triode Q1 may be connected to the signal input circuit 220.

When the signal extraction circuit 250 extracts the reverse control signal, the signal extraction circuit 250 may transmit the reverse control signal to the signal superimposing circuit 230. That is, the signal extraction circuit 250 may send a high level signal to the signal superimposing circuit 230. The signal extraction circuit 250 may first transmit the high level signal to the base terminal of the first triode Q1 through the first resistor R1. The high level signal may cause the collector terminal and the emitter terminal of the first triode Q1 forming an electric path. Since the collector terminal of the first triode Q1 is connected to the first voltage input terminal V1, the emitter terminal of the first triode Q1 may output a high level signal after the collector terminal and the emitter terminal of the first triode Q1 formed an electric path. The first triode Q1 may transmit the high level signal to the signal input circuit 220 through the second resistor R2. Since the reverse control signal is a high level signal, the signal extraction circuit 250 may transmit the reverse control signal to the signal input circuit 220 through the circuit diagram shown in FIG. 11. As shown in FIG. 11, the collector terminal of the first triode Q1 may be connected to the first voltage input terminal V1. The drive capability of the signal extraction circuit 250 for extracting the reverse control signal may be improved by the first voltage input terminal V1. It may also ensure that the reverse control signal may be transmitted to the signal input circuit 220.

In addition, when the signal output circuit 240 is not connected to the storage medium 260 through the corresponding first electronic connection, the signal output circuit 240 may not output a reverse control signal to the comparator U. At this time, the voltage value of the input signal may be 2V. If the input signal is transmitted to the comparator U, the input signal may be mistakenly extracted as a reverse control signal since the voltage value (e.g., 1.4V) of the input signal is greater than the voltage value of the predetermined reference signal 1010. Therefore, the signal distribution system 200 may further include the load detection circuit 710 and the first switch 320 to avoid the mistakenly extraction. When the load detection circuit 710 detects that the corresponding signal output circuit 240 is not connected to the storage medium 260, the load detection circuit 710 may control the corresponding first switch 320 to be open. The input signal may not be transmitted to the comparator U. Thereby, the signal extraction circuit 250 may not extract the analog video signal as a reverse control signal by mistake.

Figure 12:
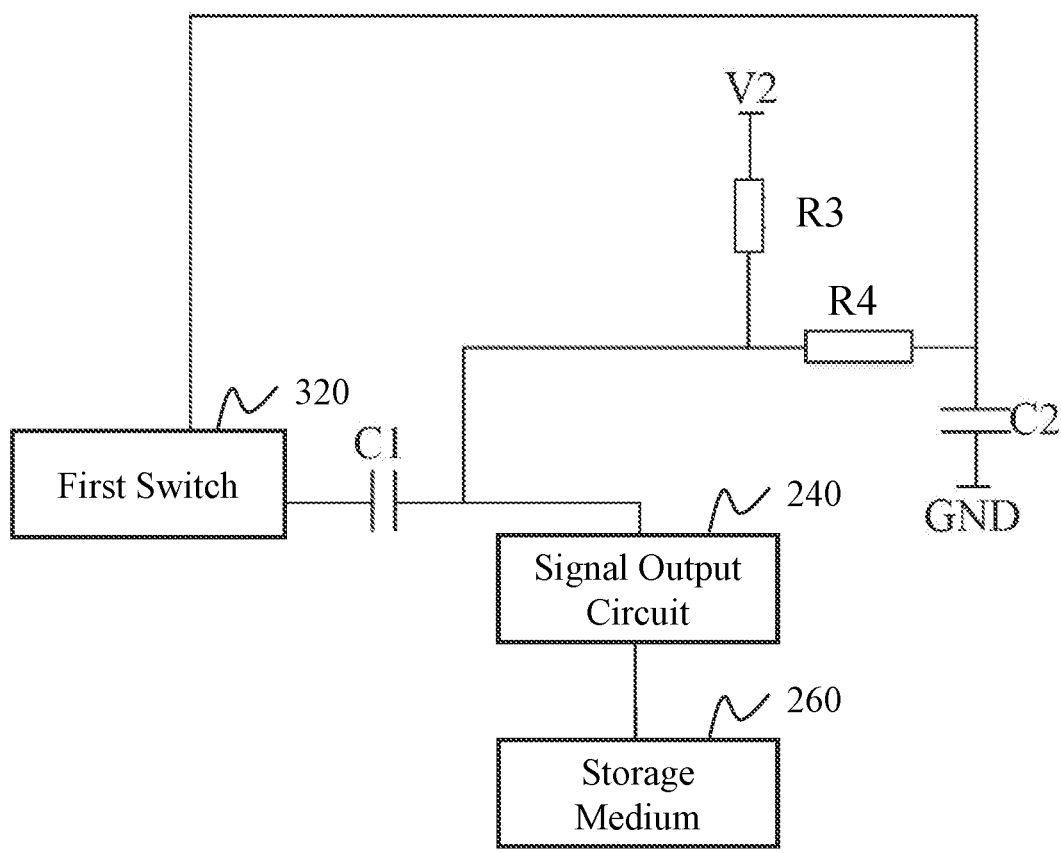
FIG. 12 is a circuit diagram illustrating an exemplary load detection circuit for detecting whether a storage medium is connected to a signal output circuit according to some embodiments of the present disclosure.

In some embodiments, the load detection may be implemented based on a software program or implemented by constructing a hardware circuit. FIG. 12 is a circuit diagram illustrating an exemplary load detection circuit for detecting whether a storage medium is connected to a signal output circuit via a first electronic connection according to some embodiments of the present disclosure. As shown in FIG. 12, the load detection circuit 710 may include a first capacitor C1, a second capacitor C2, a third resistor R3, and a fourth resistor R4.

One terminal of the first capacitor C1 may be connected to a first terminal of the corresponding first switch 320. The other terminal of the first capacitor C1 may be connected to the third resistor R3, the fourth resistor R4 and the corresponding signal output circuit 240 respectively.

One terminal of the third resistor R3 not connected to the first capacitor C1 may be connected to a second voltage input terminal V2.

One terminal of the fourth resistor R4 not connected to the first capacitor C1 may be connected to the second capacitor C2 and a second terminal of the first switch 320 respectively. One terminal of the second capacitor C2 not connected to the fourth resistor R4 may be ground connected.

As shown in FIG. 12, one terminal of the first capacitor C1 may be connected to the first terminal of the corresponding first switch 320. The other terminal of the first capacitor C1 may be connected to the third resistor R3, the fourth resistor R4 and the corresponding signal output circuit 240 respectively. Thereby, the first capacitor C1 may satisfy AC-coupled input.

When the signal output circuit 240 is connected to the storage medium 260 via the corresponding first electronic connection, the second voltage input terminal V2, the third resistor R3, the signal output circuit 240 and the storage medium 260 may form an electric path. The voltage value of a node connecting the third resistor R3 and the fourth resistor R4 may be equal to a voltage division of the storage medium 260. The voltage division value may be smaller than the voltage value of a signal output by the second voltage input terminal V2. When the voltage value of the node connecting the third resistor R3 and the fourth resistor R4 is smaller than the voltage value of the signal output by the second voltage input terminal V2, the node connecting the fourth resistor R4 and second capacitor C2 may output a low level signal. The low level signal may be the first closing signal sent from the load detection circuit 710 to the corresponding first switch 320. When the corresponding signal output circuit 240 is not connected to the storage medium 260, the second voltage input terminal V2, the third resistor R3 and the signal output circuit 240 may not form an electric path with the storage medium 260. The voltage value of the node connecting the third resistor R3 and the fourth resistor R4 may be equal to the voltage value of the signal output by the second voltage input terminal V2. At this time, the node connecting the fourth resistor R4 and second capacitor C2 may output a second high level signal. The second high level signal may be the second opening signal sent from the load detection circuit 710 to the corresponding first switch 320. In order to make the low level signal or the high level signal sent by the load detection circuit 710 more stable, the load detection circuit 710 may include the second capacitor C2 and the fourth resistor R4. One terminal of the fourth resistor R4 not connected to the first capacitor C1 may be connected to the second capacitor C2. The second capacitor C2 and the fourth resistor R4 may form a filter, which may make a level signal output by the node connecting the second capacitor C2 and the fourth resistor R4 more stable.

Figure 13A:
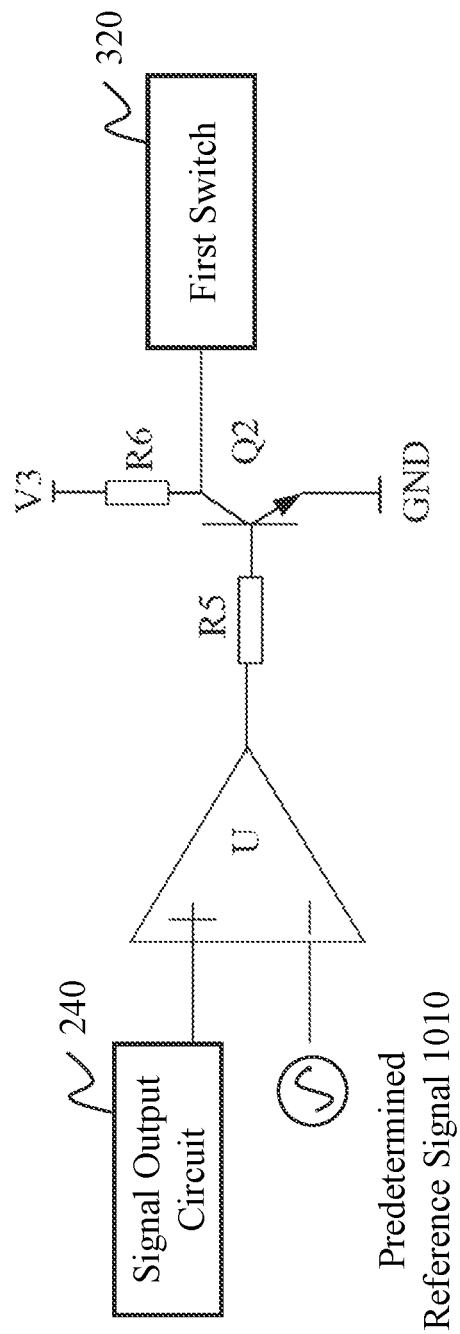
FIG. 13A is a circuit diagram illustrating an exemplary level conversion circuit for level conversion according to some embodiments of the present disclosure.
Figure 13B:
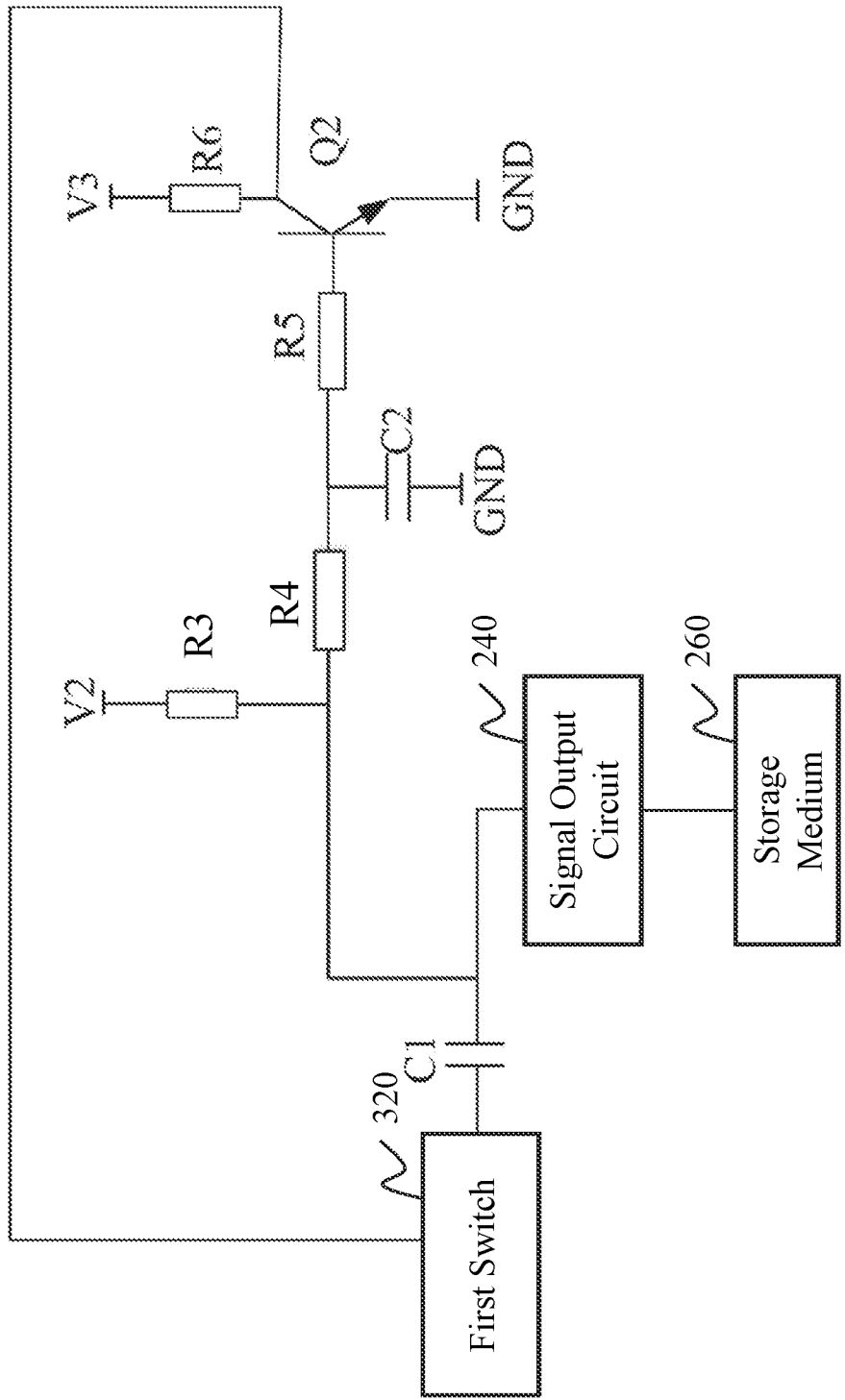
FIG. 13B is a circuit diagram illustrating an exemplary level conversion circuit for level conversion according to some embodiments of the present disclosure.

In addition, the opening signal received by the first switch 320 may also be a low level signal. The first closing signal and the second closing signal received by the first switch 320 may also be a high level signal. Under this circumstance, it is necessary to add a level conversion circuit to the structure of the signal extraction circuit 250 and the load detection circuit 710. As shown in FIG. 13A, the level conversion circuit may include a fifth resistor R5, a sixth resistor R6 and a second triode Q2. One terminal of the fifth resistor R5 may be connected to the output terminal of the comparator U shown in FIG. 10. As shown in FIG. 13B, one terminal of the fifth resistor R5 may be connected to the node connecting the fourth resistor R4 and the second capacitor C2 shown in FIG. 12. The fifth resistor R5 may be connected to a base terminal of the second triode Q2. A collector terminal of the second triode Q2 may be connected to the sixth resistor R6 and the corresponding first switch 320 respectively. One terminal of the sixth resistor R6 not connected to the collector terminal of the second triode Q2 may be connected to a third voltage input terminal V3. An emitter terminal of the second triode Q2 may be ground connected.

As shown in FIG. 13A or FIG. 13B, when the fifth resistor R5 receives a high level signal, the high level signal may be transmitted to the base terminal of the second triode Q2. Thereby, the collector terminal and the emitter terminal of the second triode Q2 may form an electric path. Since the emitter terminal of the second triode Q2 is ground connected, the collector terminal of the second triode Q2 may output a low level signal to the corresponding first switch 320. The low level signal may be an opening signal. When the fifth resistor R5 receives a low level signal, the low level signal may be transmitted to the base terminal of the second triode Q2. Thereby, the collector terminal and the emitter terminal of the second triode Q2 may form an electric path. Since the collector terminal of the second triode Q2 is connected to the third voltage input terminal V3 through the sixth resistor R6, the collector terminal of the second triode Q2 may output a high level signal to the corresponding first switch 320. The high level signal may be the first closing signal or the second closing signal. Therefore, in some embodiments of the present disclosure, the opening signal output to the corresponding first switch 320 may be a low level signal or a high level signal. The first closing signal or the second closing signal may be a high level signal or a low level signal.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure and are within the spirit and scope of the exemplary embodiments of this disclosure.

Moreover, certain terminology has been used to describe embodiments of the present disclosure. For example, the terms "one embodiment," "an embodiment," and/or "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, various aspects of the present disclosure may be performed entirely by hardware and may be performed entirely by software (including firmware, resident software, microcode), or may be implemented by a combination of both. The above hardware or software may be referred to as "data block," "circuit," "engine," "unit," "component," or "system." Furthermore, aspects of the present disclosure may take the form of a computer program product embodied in one or more computer readable media having computer readable program code embodied thereon.

A computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object-oriented programming language such as Java, Scala, Smalltalk, Eiffel, JADE, Emerald, C++, C#, VB. NET, Python or the like, conventional procedural programming languages, such as the "C" programming language, Visual Basic, Fortran 2003, Perl, COBOL 2002, PHP, ABAP, dynamic programming languages such as Python, Ruby, and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations, therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution—e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various inventive embodiments. This method of disclosure, however, is not to be interpreted as reflecting an intention that the claimed subject matter requires more features than are expressly recited in each claim. Rather, inventive embodiments lie in less than all features of a single foregoing disclosed embodiment.

In some embodiments, the numbers expressing quantities or properties used to describe and claim certain embodiments of the application are to be understood as being modified in some instances by the term "about," "approximate," or "substantially." For example, "about," "approximate," or "substantially" may indicate ±20% variation of the value it describes, unless otherwise stated. Accordingly, in some embodiments, the numerical parameters set forth in the written description and attached claims are approximations that may vary depending upon the desired properties sought to be obtained by a particular embodiment. In some embodiments, the numerical parameters should be construed in light of the number of reported significant digits and by applying ordinary rounding techniques. Notwithstanding that the numerical ranges and parameters setting forth the broad scope of some embodiments of the application are approximations, the numerical values set forth in the specific examples are reported as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. A system, comprising:
    at least one signal input circuit configured to receive target input signals from at least one sensor device;
    at least one signal processing unit configured to output signals to a first electronic connection and obtain a reverse control signal; and
    a signal distributor connected to the at least one signal input circuit,
    wherein each of the at least one signal processing unit includes:
    at least one switch connected to the signal distributor, wherein the at least one switch is configured to connect the signal distributor and the signal processing unit for the signal distributor distributing the target input signals to the at least one signal processing unit, or disconnect the signal distributor and the signal processing unit for preventing the target input signals from being extracted as the reverse control signal;

wherein the at least one signal processing unit includes a first resistor, a second resistor, and a first triode, and wherein a first terminal of the first resistor is connected to each of the at least one signal processing unit, and a second terminal of the first resistor is connected to a base terminal of the first triode;

a collector electrode of the first triode is connected to a first voltage input port, and an emitter electrode of the first triode is connected to a first terminal of the second resistor; and a second terminal of the second resistor is connected to the at least one signal input circuit.

2. The system of claim 1, wherein the signal distributor includes at least one high bandwidth video filtering driver chip, or the signal distributor includes an analog signal decoding chip, a digital signal processing circuit, and at least one analog signal coding chip.

3. The system of claim 1, wherein each of the at least one processing unit includes at least one signal output circuit configured to output signals to the first electronic connection.

4. The system of claim 3, wherein the at least one switch includes:

at least one input terminal connected to the signal distributor;

at least one output terminal connected to the at least one signal output circuit; and at least one control terminal connected to the at least one signal processing unit.

5. The system of claim 4, further comprising:

at least one storage medium connected to the at least one signal processing unit via the first electronic connection, wherein the at least one storage medium is a digital video recorder (DVR); and wherein the at least one sensor device is connected to the at least one signal input circuit via a second electronic connection, the at least one sensor device includes a camera, and the target input signals are analog video signals.

6. The system of claim 3, wherein the at least one signal processing unit is further configured to:

detect the reverse control signal via the first electronic connection, and in response to a detection of the reverse control signal from the first electronic connection, disconnect the at least one switch to disconnect the signal distributor from the at least one signal output circuit.

7. The system of claim 3, further comprising at least one load detection circuit connecting the at least one signal output circuit with the at least one switch.

8. The system of claim 7, wherein the at least one load detection circuit is configured to:

detect whether the at least one signal output circuit is connected to the storage medium via the first electronic connection;

in response to a detection that the storage medium is not connected to the at least one signal output circuit, control the at least one switch to disconnect the signal distributor from the at least one signal output circuit.

9. The system of claim 8, wherein the at least one load detection circuit is configured to:

in response to a detection that the storage medium is connected to the signal output circuit via the first electronic connection, the load detection circuit sends a first closing signal to the at least one switch;

in response to a detection of the reverse control signal from the first electronic connection, the at least one signal processing unit sends a second closing signal to the at least one switch; and the at least one switch closes upon receiving the first closing signal and the second closing signal.

10. The system of claim 7, wherein the at least one signal processing unit includes a plurality of signal extraction circuits; and the system further comprises at least one first OR gate connecting the plurality of signal extraction circuits with the at least one output terminal of the at least one switch.

11. The system of claim 10, wherein a signal extraction circuit is configured to:

in response to the detection of the reverse control signal from the first electronic connection, send a first disconnecting signal to the at least one first OR gate to control the at least one first OR gate to transmit a disconnecting signal to the at least one switch.

12. The system of claim 10, wherein the at least one load detection circuit is further configured to:

in response to the detection that the storage medium is not connected to the at least one signal processing unit, send a second disconnecting signal to the at least one first OR gate to control the at least one first OR gate to transmit a disconnecting signal to the at least one switch.

13. The system of claim 12, wherein the at least one load detection circuit and the at least one signal processing unit are further configured to:

in response to the detection that the storage medium is not connected to the at least one signal output circuit, send a first closing signal to the at least one first OR gate; and in response to a detection that no reverse control signal is transmitted from the first electronic connection, send a second closing signal to the at least one first OR gate.

14. The system of claim 13, wherein the at least one first OR gate is further configured to control the at least one switch to close upon receiving the first closing signal and the second closing signal.

15. The system of claim 10, further comprises at least one second OR gate connecting the plurality of signal extraction units and the at least one signal superimposing circuit.

16. The system of claim 15, wherein the signal extraction circuit is further configured to control the at least one second OR gate to breakover to transmit the reverse control signal to the at least one signal processing unit.

17. The system of claim 10, wherein the signal extraction circuit includes a comparator circuit including a non-inverting input port, an inverting input port, and an output port, and wherein:

the non-inverting input terminal is connected to a corresponding signal output circuit of the at least one signal output circuit;

the inverting input terminal is connected to a predetermined reference signal input port; and the output terminal is connected to a corresponding signal superimposing circuit of the at least one signal processing unit.

18. The system of claim 7 wherein each of the at least one load detection circuit includes a first capacitor, a second capacitor, a third resistor and a fourth resistor, and wherein:

a first terminal of the first capacitor is connected to a first terminal of a corresponding switch, and a second terminal of the first capacitor is connected to a first terminal of the third resistor, a first terminal of the fourth resistor and the signal output circuit respectively;

a second terminal of the third resistor is connected to a second voltage input port;

a second terminal of the fourth resistor is connected to a first terminal of the second capacitor, and a second terminal of the corresponding switch respectively; and a second terminal of the second capacitor is ground connected.

19. The system of claim 1, wherein the at least one switch includes:

at least one input terminal connected to the signal distributor;

at least one output terminal connected to the at least one signal output circuit; and at least one control terminal connected to the at least one signal processing unit.

\* \* \* \* \*